US012609528B2

(12) United States Patent
Patodi et al.

(10) Patent No.: US 12,609,528 B2
(45) Date of Patent: Apr. 21, 2026

(54) DC FAULT MANAGED POWER SYSTEM

(71) Applicant: Schneider Electric USA, Inc., Andover, MA (US)

(72) Inventors: Paras Patodi, Mumbai (IN); John Shea, Wake Forest, NC (US)

(73) Assignee: Schneider Electric USA, Inc., Boston, MA (US)

( * ) Notice: Subject to any disclaimer, the term of this patent is extended or adjusted under 35 U.S.C. 154(b) by 264 days.

(21) Appl. No.: 18/388,269

(22) Filed: Nov. 9, 2023

(65) Prior Publication Data

US 2024/0421594 A1 Dec. 19, 2024

(30) Foreign Application Priority Data

Jun. 16, 2023 (IN) ............................. 202311041147

(51) Int. Cl.
| | |
|---|---|
| *H02J 1/08* | (2026.01) |
| *G01R 19/165* | (2006.01) |
| *G01R 31/40* | (2020.01) |
| *G01R 35/00* | (2006.01) |

(52) U.S. Cl.
CPC ........ *H02J 1/084* (2020.01); *G01R 19/16528* (2013.01); *G01R 31/40* (2013.01); *G01R 35/005* (2013.01)

(58) Field of Classification Search
CPC ... H02J 1/084; G01R 19/16528; G01R 31/40; G01R 35/005
USPC ......................................... 324/600, 601, 606
See application file for complete search history.

(56) References Cited

U.S. PATENT DOCUMENTS

| | | | |
|---|---|---|---|
| 10,714,930 B1 | 7/2020 | Weiss et al. | |
| 11,460,516 B2 * | 10/2022 | Hsu | G01R 31/3004 |
| 11,899,045 B2 * | 2/2024 | Porter | G01R 35/005 |
| 12,259,411 B2 * | 3/2025 | Schneider | H02J 7/345 |

(Continued)

FOREIGN PATENT DOCUMENTS

WO      2022081778 A1    4/2022

OTHER PUBLICATIONS

European Search Report and Search Opinion completed Dec. 2, 2024 for corresponding European Patent Application No. 24181135. 5, 9 pages.

*Primary Examiner* — Giovanni Astacio-Oquendo
(74) *Attorney, Agent, or Firm* — Wolf, Greenfield & Sacks, P.C.

(57) ABSTRACT
Method and system are provided to calibrate detection of condition(s) on an electrical system with a source circuit. The method and system involve measuring using a sensor reference voltages across the source circuit to be supplied downstream in the open circuit state at a first system voltage for calibration; and measuring using the sensor a voltage in the open circuit state when a second system voltage is applied to the source circuit. The method and system further scales a reference voltage from the reference voltages according to a ratio between first and second system voltages; calculates a difference between the scaled reference voltage and a current voltage measured by the sensor; calculates a voltage change over time between prior and current voltages; compares the difference and the voltage change over time to respective thresholds; and in response to the comparison, determines whether a condition on the electrical system has occurred.

20 Claims, 17 Drawing Sheets

(56)         References Cited

U.S. PATENT DOCUMENTS

| | | | |
|---|---|---|---|
| 2022/0050135 A1 | 2/2022 | Nordin et al. | |
| 2022/0311240 A1 | 9/2022 | Casey | |
| 2023/0013202 A1* | 1/2023 | Ting | B60R 16/0215 |
| 2023/0205294 A1* | 6/2023 | Park | G01R 31/40 |
| 2024/0219433 A1* | 7/2024 | Schneider | G01R 19/0046 |

* cited by examiner

400

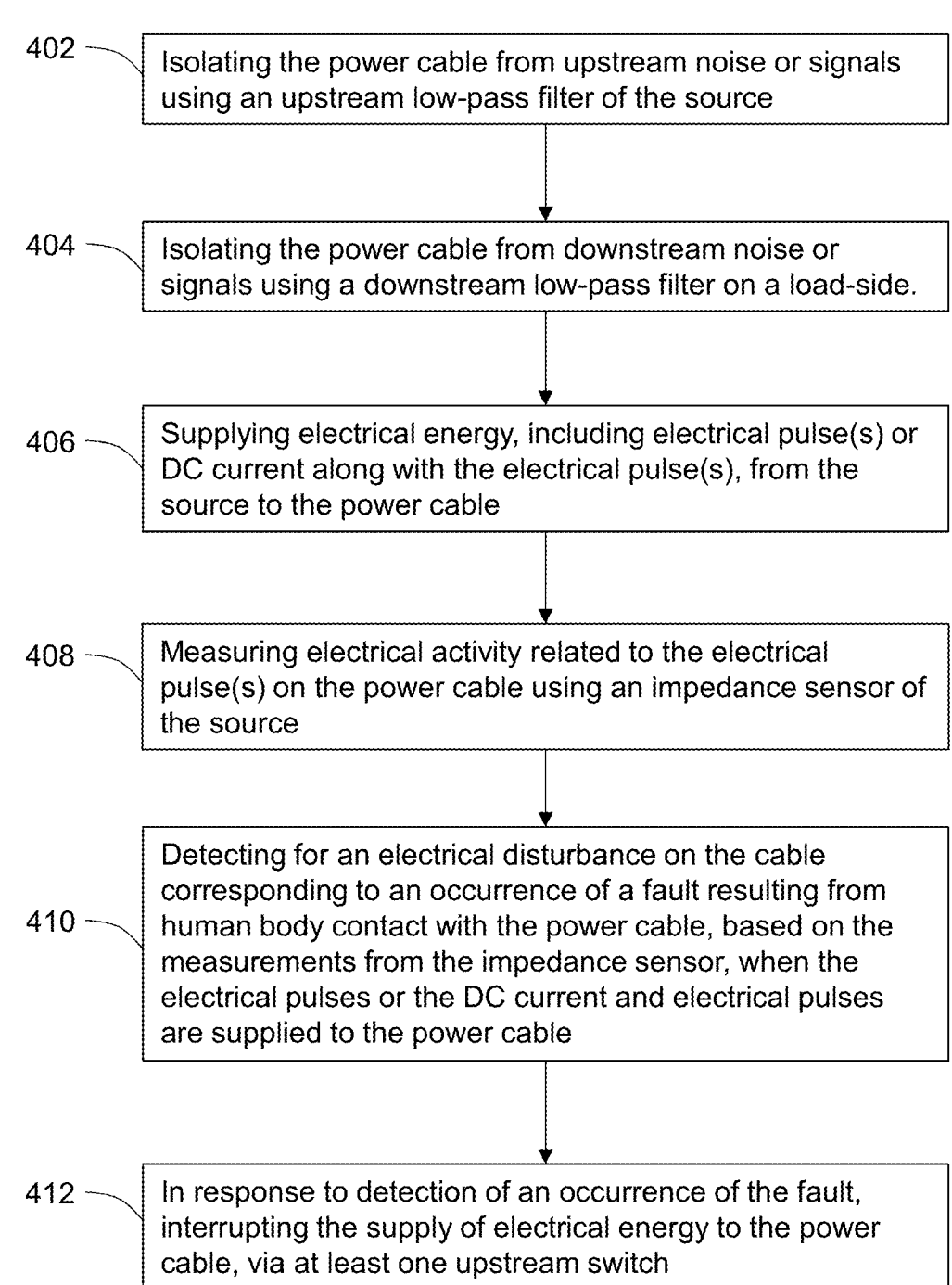

402 — Isolating the power cable from upstream noise or signals using an upstream low-pass filter of the source 404 — Isolating the power cable from downstream noise or signals using a downstream low-pass filter on a load-side.

406 — Supplying electrical energy, including electrical pulse(s) or DC current along with the electrical pulse(s), from the source to the power cable 408 — Measuring electrical activity related to the electrical pulse(s) on the power cable using an impedance sensor of the source 410 — Detecting for an electrical disturbance on the cable corresponding to an occurrence of a fault resulting from human body contact with the power cable, based on the measurements from the impedance sensor, when the electrical pulses or the DC current and electrical pulses are supplied to the power cable 412 — In response to detection of an occurrence of the fault, interrupting the supply of electrical energy to the power cable, via at least one upstream switch

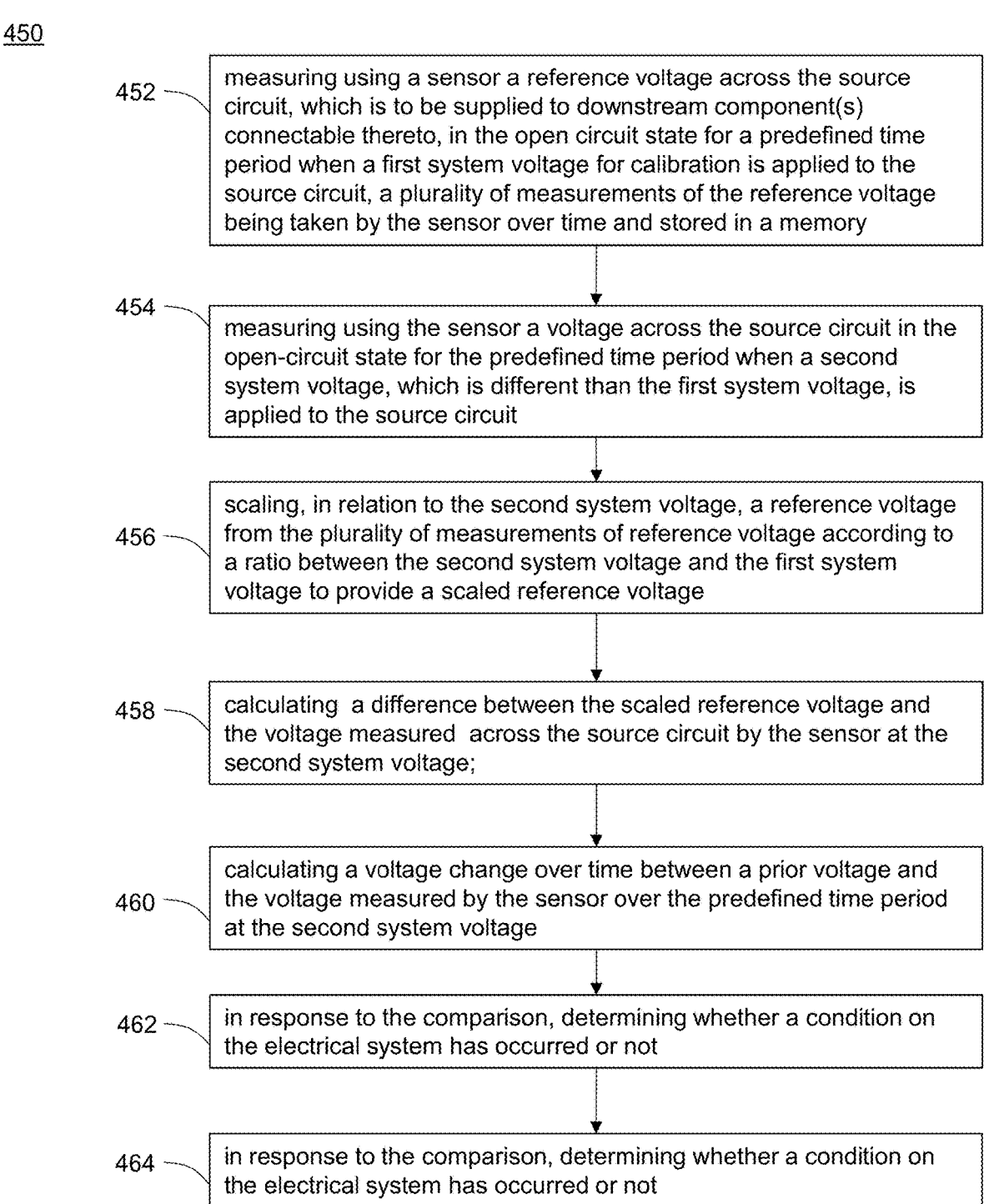

452 — measuring using a sensor a reference voltage across the source circuit, which is to be supplied to downstream component(s) connectable thereto, in the open circuit state for a predefined time period when a first system voltage for calibration is applied to the source circuit, a plurality of measurements of the reference voltage being taken by the sensor over time and stored in a memory 454 — measuring using the sensor a voltage across the source circuit in the open-circuit state for the predefined time period when a second system voltage, which is different than the first system voltage, is applied to the source circuit 456 — scaling, in relation to the second system voltage, a reference voltage from the plurality of measurements of reference voltage according to a ratio between the second system voltage and the first system voltage to provide a scaled reference voltage 458 — calculating a difference between the scaled reference voltage and the voltage measured across the source circuit by the sensor at the second system voltage;

460 — calculating a voltage change over time between a prior voltage and the voltage measured by the sensor over the predefined time period at the second system voltage 462 — in response to the comparison, determining whether a condition on the electrical system has occurred or not 464 — in response to the comparison, determining whether a condition on the electrical system has occurred or not

FIG. 4B

Point-to-Point

600

Radial

700

Daisy-Chain

800

Fishbone

900

Vref_Table Sample data

Pos RefVolt[REFERENCE_VOLTAGE_ARRAY] =

```
{3668, 3671, 3667, 3663, 3662, 3658, 3659, 3660, 3655, 3656,
 3650, 3652, 3646, 3645, 3639, 3635, 3630, 3629, 3623, 3623,
 3620, 3623, 3617, 3613, 3612, 3613, 3603, 3607, 3602, 3600,
 3598, 3593, 3595, 3585, 3587, 3597, 3581, 3579, 3575, 3578,
 3574, 3575, 3578, 3571, 3566, 3566, 3568, 3560, 3556, 3558,
 3553, 3550, 3551, 3544, 3541, 3542, 3538, 3533, 3534, 3533,
 3524, 3526, 3525, 3519, 3517, 3517, 3515, 3509, 3510, 3512,
 3506, 3505, 3501, 3500, 3496, 3498, 3488, 3488, 3490, 3490,
 3483, 3476, 3481, 3481, 3478, 3476, 3475, 3467, 3471, 3463,
 3460, 3461, 3454, 3455, 3450, 3445, 3444, 3438, 3438, 3439,
 3435, 3429, 3428, 3429, 3427, 3432, 3423, 3424, 3419, 3414,
 3419, 3413, 3407, 3406, 3410, 3403, 3401, 3399, 3386, 3404,
 3391, 3398, 3389, 3388, 3385, 3387, 3386, 3377, 3378, 3376,
 3376, 3367, 3366, 3359, 3361, 3363, 3353, 3355, 3354, 3351,
 3344, 3344, 3340, 3338, 3339, 3333, 3332, 3334, 3329, 3327,
 3330, 3326, 3330, 3323, 3321, 3318, 3314, 3311, 3311, 3312,
 3306, 3303, 3306, 3304, 3299, 3312, 3293, 3299, 3290, 3288,
 3284, 3282, 3280, 3279, 3273, 3276, 3272, 3269, 3261, 3259,
 3266, 3257, 3260, 3251, 3259, 3253, 3256, 3251, 3241, 3244,
 3239, 3239, 3238, 3235, 3233, 3230, 3224, 3233, 3224, 3224,
 3227, 3222, 3223, 3218, 3221, 3216, 3215, 3206, 3205, 3201,
 3199, 3196, 3195, 3193, 3189, 3190, 3187, 3180, 3177, 3180,
 3175, 3174, 3181, 3182, 3169, 3168, 3164, 3175, 3164, 3160,
 3158, 3155, 3155, 3148, 3150, 3149, 3149, 3155, 3144, 3145,
 3139, 3144, 3139, 3133, 3132, 3136, 3128, 3125, 3122};
```

Neg RefVolt[REFERENCE_VOLTAGE_ARRAY] =

DC FAULT MANAGED POWER SYSTEM

PRIORITY INFORMATION

The present application claims the benefit of and priority to Indian Provisional Patent Application Serial No. 202311041147, filed Jun. 16, 2023. The disclosure of the above-identified prior Patent Application is incorporated herein by reference in its entirety.

FIELD

The present disclosure is generally directed to fault protection in electrical power supplies and, more particularly, to methods and systems for isolating power cable to detect conditions to limit the energy provided into a fault, including touch-safe levels.

BACKGROUND

Power over Ethernet (PoE) generally refers to the use of a conductor pair, typically a twisted-pair or an Ethernet cable, to simultaneously send both electrical power and data. Thus, devices that can be powered via PoE, called powered devices (PD), generally do not require a separate power adapter to power the devices. Examples of powered devices include VoIP phones, HD video cameras (pan-zoom-tilt cameras), wireless access points (WAP), network routers, among other devices. The number of powered devices is expected to increase exponentially as demand for so-called "smart building" services grow.

PFC (Power and Fiber Cable) is similar to PoE insofar as electrical power and data are supplied over a single cable, thereby eliminating (or at least diminishing) the need for a separate power adapter to power the devices. With PFC, the data is sent over an optical fiber while the power is typically supplied over a conductive sheath, usually copper, that surrounds the optical fiber. A typical PFC cable can send data over a much greater distance compared to a typical PoE cable due to the lossless or nearly lossless characteristic of optical fibers.

In applications like PoE and PFC, power is typically injected onto the cable at between 44 and 57 Vdc, and typically 48 Vdc. This voltage level allows power to be efficiently transferred along the cable while still being low enough to be safe for end-users. The maximum power level allowed by the original industry standard for PoE power sourcing equipment (PSE) is 30 W. The new PoE standard, or PoE++ (IEEE 802.3bt), allows power levels up to 100 W. Standards that contemplate even higher power levels are being developed.

As power levels continue to increase in applications like PoE and PFC, a need exists for a way to ensure that the amount of energy provided into a fault is limited.

SUMMARY

In accordance with an embodiment, a fault managed power system is provided. The power system can comprise a source, a power cable, and downstream component(s), such as load-side component(s). The power cable can include at least one electrically conductive line for carrying electrical energy. The source can be connected upstream of the power cable, and can supply electrical energy, including electrical pulses or DC current/voltage along with the electrical pulses, to the power cable. The source can include: an upstream low-pass filter, connected between an electrical power supply and the power cable, for isolating the power cable from upstream noise or signals; a sensor including an impedance sensor tank circuit for measuring electrical activity related to the electrical pulses on the power cable; at least one upstream switch arranged upstream from the power cable, and at least one controller. The at least one controller can be configured to: detect for an electrical disturbance on the power cable corresponding to an occurrence of a fault resulting from human body contact with the cable (or a conductive component thereof), based on the measurements from the impedance sensor tank circuit, when the electrical pulses or the DC current/voltage along with the electrical pulses are supplied to the power cable, and in response to detection of the occurrence of a fault, interrupting the supply of electrical energy to the power cable, via at least the at least one upstream switch. The downstream component(s) can be connected downstream of the power cable and can receive the electrical energy supplied across the power cable. The downstream component(s) can include a downstream low-pass filter for isolating the power cable from downstream noise or signals.

In various embodiments, the impedance sensor tank circuit can be configured to sense impedance changes on the power cable or leakage current on the cable. The sensor can include an impedance sensor with an RC component, and a pi-filter with an LC component. A capacitor in the impedance sensor and inductor in the pi-filter can form the tank circuit to amplify a fault signal on the cable In various embodiment, the at least one upstream switch can include a switch, which is turned ON and OFF, to generate the electrical pulse(s). The at least one upstream switch can comprise a solid-state switch or a crowbar circuit.

In various embodiments, the source can further comprise an upstream power converter, which is upstream of the upstream low-pass filter, for converting electrical energy supplied from the power supply. The downstream component(s) can further comprise a downstream power converter, which is downstream of the downstream low-pass filter, for converting electrical energy received from the power cable and supplying the converted electrical energy to a downstream load.

In various embodiments, the at least one switch can comprise: a first upstream switch; a second upstream switch which comprises a solid-state switch; and a third upstream switch which comprises a crowbar circuit. The second upstream switch can be operated to interrupt supply of the DC current/voltage to the power cable in response to the detection of the occurrence of a fault, and the third upstream switch can be operated to interrupt supply of the DC current/voltage to the power cable by short-circuiting the upstream source in response to detection of the occurrence of a fault. When a number of detected occurrences of a fault satisfies a count, the first upstream switch can be operated to interrupt supply of DC current/voltage to the power cable, and power supply operations are stopped. Optionally, a fourth switch, located at the output of the source, between the impedance sensor and the power cable can be opened to prevent DC current/voltage from being applied to the power cable.

The at least one controller can be further configured to: control the generation of an electrical pulse at a start-up stage, by momentarily closing a solid state switch (e.g., S2) to produce the pulse, before enabling supply of the DC current/voltage. The at least one controller can detect for an occurrence of a fault based on the measurements from the impedance sensor tank circuit, when the electrical pulse is supplied to the power cable, and in response to detection of the occurrence of a fault, not turning on S2, preventing DC voltage from being applied to the circuit and optionally operating the third switch.

The at least one controller can be further configured to: when the occurrence of a fault is not detected during the start-up stage, operate the second upstream switch to supply DC current/voltage from the source to the power cable. The at least one controller can detect for an occurrence of a fault based on the measurements of the electrical activity from the impedance sensor tank circuit, when the DC current/voltage along with the electrical pulses are supplied to the power cable, and in response to detection of the occurrence of a fault, interrupt a supply of DC current/voltage and electrical pulses to the power cable, using the second and third upstream switches.

In various embodiments, the cable can comprise a twisted 2-wire cable or a twisted 3-wire cable, the upstream and downstream low-pass filters can comprise x-filters, and/or power line communication can be performed across the power cable.

In various embodiments, the fault can comprise a fault resulting from line-to-line human body contact on the power cable or, a fault resulting from line-to-ground human body contact on the power cable.

In various embodiments, the source can be configured to supply the electrical pulses during a start-up stage before enabling supply of the DC current voltage or the DC current/voltage along with the electrical pulses during steady state operation.

In accordance with an embodiment, a method is provided for implementing fault managed power according to the fault managed power system as described herein.

In accordance with another embodiment, a method and system are provided to calibrate a detection system for detecting a condition on an electrical system. The electrical system includes a source circuit configured to electrically connect to or disconnect from downstream circuit into a closed circuit state or an open circuit state respectively. The method involves:

measuring using a sensor a reference voltage across the source circuit in the open circuit state for a predefined time period when a first system voltage for calibration is applied to the source circuit, a plurality of measurements of the reference voltage being taken by the sensor over time and stored in a memory;

measuring using the sensor a voltage across the source circuit in the open circuit state for the predefined time period when a second system voltage, which is different than the first system voltage, is applied to the source circuit, scaling, in relation to the second system voltage, a reference voltage from the plurality of measurements of reference voltage according to a ratio between the second system voltage and the first system voltage to provide a scaled reference voltage;

calculating a difference between the scaled reference voltage and the voltage measured across the source circuit by the sensor at the second system voltage;

calculating a voltage change over time between a prior voltage and the voltage measured by the sensor over the predefined time period at the second system voltage;

comparing the difference and the voltage change over time to respective thresholds; and in response to the comparison, determining whether a condition on the electrical system has occurred or not.

In various embodiments, the thresholds and the plurality of measurements of reference values are scaled according to a ratio between the second system voltage and the first system voltage.

In various embodiments, in the electrical system, the source circuit includes a low-pass filter and is connected to a power cable, which in turn is connected to downstream electrical component(s) including at least a low-pass filter. The low-pass filters of the source circuit and downstream electrical component(s) prevent upstream and downstream noise or signals across the power cable. The sensor is situated between the low-pass filter of the source circuit and the power cable to sense voltage across the power cable. The condition includes a fault resulting from body contact with the power cable or other types of faults.

In various embodiments, the method and system can further involve: detecting a type of circuit configuration of the downstream circuit; and configuring the thresholds according to the detected configuration of the downstream circuit. The type of circuit configuration includes a single load or a plurality of loads.

In various embodiments, the scaling operation can include: calculating a ratio of the second system voltage to the first system voltage; and calculating the scaled reference voltage which is equal to the calculated ratio multiplied by the reference voltage from the plurality of measurements of reference voltage.

In various embodiments, the sensor includes an RC-circuit or an impedance sensor, the reference voltage and the current voltage being a measurement of a voltage across a capacitor of the RC-circuit or impedance sensor.

In various embodiments, the source circuit includes a plurality of switches having a first switch configured to electrically connect or disconnect the source circuit to or from a system input supplying system voltage, and a second switch configured to electrically connect or disconnect the source circuit to or from a downstream circuit. Furthermore, the method and system can further involve: in response to a detection of a condition, interrupting a supply of power to the downstream circuit via one or more of the plurality of switches.

In various embodiments, in the method and system, the scaling operation and calculating operations are performed according to the following equations:

$$\text{Ratio} = Vs/Vrated;$$

$$Vs = Vin/(R1 + R2)/R2;$$

$$Vref[i] = \text{Ratio} * \text{Vref\_Table}[i];$$

$$\text{Delta} = Vref[i] - VC[i]; \text{ and}$$

$$\text{Slope} = (VC[i-1] - VC[i])/Tdelta,$$

where:

Vrated is a first system voltage for the source circuit for calibration,

Vs is a second system voltage corresponding to an applied system voltage for the source circuit, $V_{in}$ is a scaled second system voltage corresponding to an applied (operating) system voltage for the source circuit, V_Ref2, V_Ref3, V_Ref4, V_Ref5, . . . , V_Refn), Tdelta is a step time or time interval, Delta is the difference, Slope is the voltage change over time, and i=1 to n.

It is to be understood that both the foregoing general description and the following detailed description are exemplary and explanatory only and are not restrictive of the invention, as disclosed or claimed. The claims should be entitled to their full breadth of scope, including equivalents.

DESCRIPTION OF THE FIGURES

The description of the various example embodiments is explained in conjunction with the appended drawings.

FIG. 4A illustrates an example process of operating a fault managed power system or components thereof, which employ power cable isolation techniques, in accordance with an embodiment of the present disclosure.

FIG. 4B illustrates an example calibration process for a detection system of an electrical or power system, in accordance with an embodiment of the present disclosure.

FIG. 20 illustrates an example of sample data of a calibration table such as voltage reference (Vref) Table, in accordance with an embodiment of the present disclosure.

DISCUSSION OF EXAMPLE EMBODIMENTS

Figure 1A:
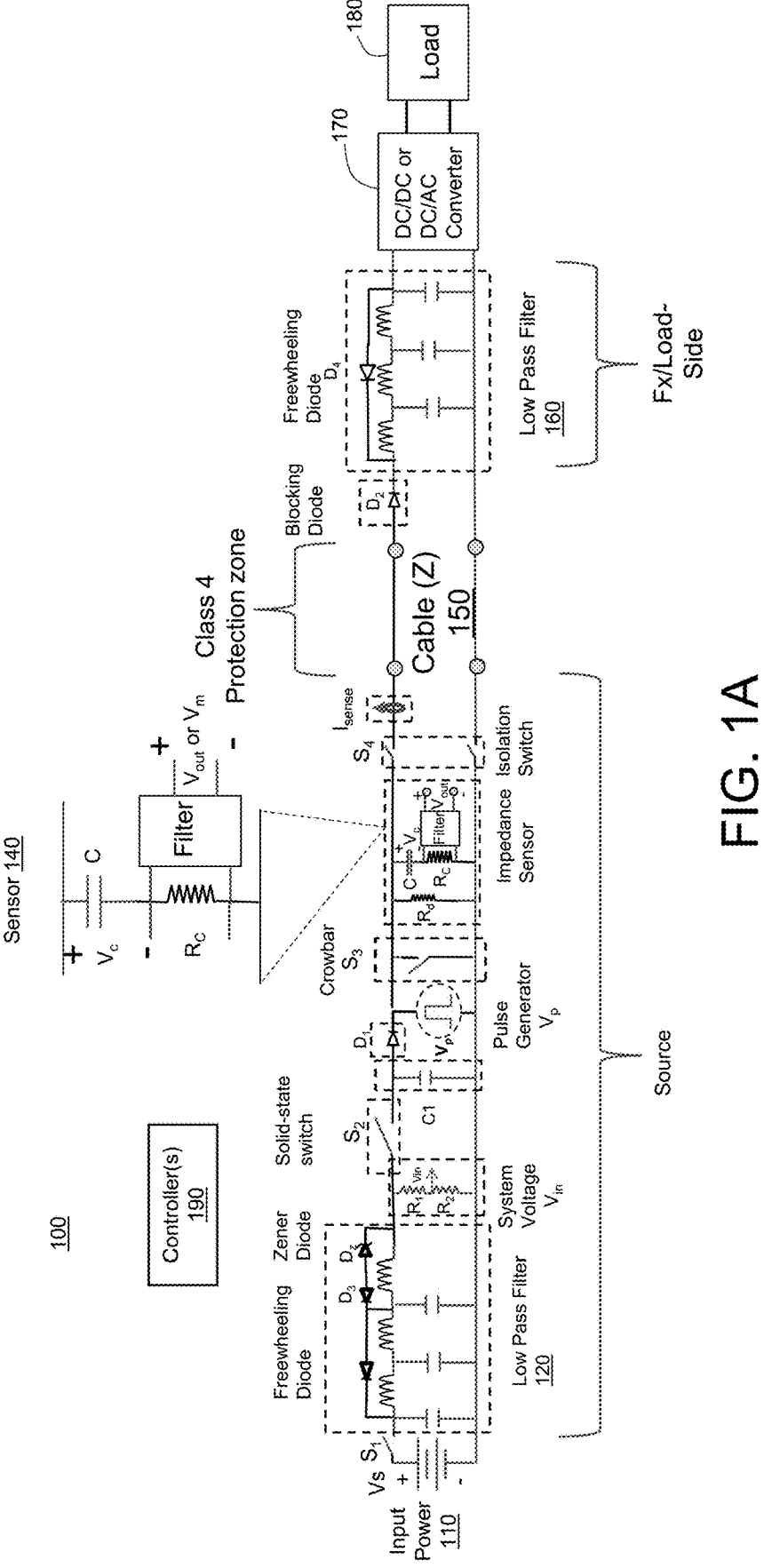
FIG. 1A illustrates an example of a block diagram of a fault managed power system, which employs power cable isolation techniques, in accordance with an embodiment of the present disclosure.

A fault managed power system and a method of implementing such a power system are provided for managing power across a power cable, including at least one electrical conductor (or line), in accordance with an embodiment. The fault managed power system can include an upstream component(s) (also referred to as "source"), a downstream component(s) (also referred to as "load-side component(s) or "Fx") and an electrical power cable for delivering DC current/voltage (e.g., DC steady state current) from the source to the downstream component(s). The power system can employ filters, which are upstream and downstream of the power cable, to isolate the power cable from an upstream power supply and a downstream load(s), thereby providing noise-free DC current/voltage across the cable. Human body contact with the cable creates an electrical disturbance on the cable. A pulse generator or generating circuitry in combination with a sensor system including an impedance sensor can be used to measure electrical activity on the cable, prior to energizing the load (e.g., prior to supplying DC current/voltage during a start-up stage) and during a steady state operation/stage when DC current/voltage also is supplied. An occurrence of a fault, including but not limited to a fault resulting from human body contact with the cable, can be detected based on measurements taken by the sensor system. In various embodiments, the sensor system can include an impedance sensor, a frequency selective filter such as a pi-filter and amplifier circuit, and can measure electrical disturbances on the cable to facilitate detection of human body contact or other faults on the cable. The capacitor in the impedance sensor and inductor in the pi-filter can form a tank circuit to amplify a fault signal on the power cable. The power system also can employ electronic switches to interrupt (or prevent) supply of electrical energy to the power cable in response to detection of the occurrence of a fault. The use of electronic switches enables fast turn-off of supply of electrical energy to the cable, thereby resulting in electrical shock protection below the UL established let-go limits.

The fault managed power method and system of the present disclosure can provide various benefit(s)/ advantage(s). For example, the method and system can be configured to sense differential (line-to-line) in addition to ground-fault (line-to-ground) leakage currents for enhanced shock and fire safety. The fault managed power method and system also can employ DC current/voltage, such as DC steady state current, between source and downstream component(s) which can improve efficiency, and eliminate EMI/ RFI switching noise, thereby allowing for powerline communication for data transfer, and control of the load. The fault managed power method and system also can provide for class 4 power (or wiring), which can carry higher power levels (e.g., to 450 Volts) than for example Class 2 power, while at the same time providing for enhanced shock and fire safety.

In various embodiments, fault detection can be performed during a start-up stage before DC current/voltage is supplied to the power cable, and/or during the steady state operation stage when DC current/voltage is supplied to the power cable.

In various embodiments, the upstream and downstream filters can be low-pass filters. The low-pass filters can be π-filters, or other low-pass filters.

In various embodiments, electrical pulses, such as voltage pulses, can be generated which can have a pulse frequency within the frequency range which is filtered-out by the filters. For example, the frequency can be a high frequency, and the magnitude of the voltage can be sufficiently small (e.g., within a touch-safe range). The upstream sensor can be configured to measure frequency signals in the pulse frequency range to facilitate detection of any electrical disturbances on the power cable.

In various embodiments, the fault managed power method and system also can employ the impedance sensor to detect for faults due to human body contact with the cable as well as other types of faults on the cable. The detectable faults can include but are not limited to line-to-line faults, and line-to-ground faults.

In various embodiments, the fault managed power method and system can be employed in different power distribution architectures, such as for example, Point-to Point architecture, Radial architecture, Daisy-Chain architecture, Fishbone architecture (which may employ junction boxes).

In various embodiments, the fault managed power method and system can be employed various power cable configurations, such as for example, 2-wire (twisted), 3-wire (twisted), and so forth. The power cable also can be unshielded or shielded. The power cable also can supply unipolar or bipolar electrical energy (e.g., voltage, current, etc.).

In various embodiments, the fault managed power method and system can use one or more switches to interrupt (or prevent) supply of electrical energy to the power cable. The one or more switches can include, for example, electro-mechanical switch, electronic switch, crowbar circuit, or other switching circuit and/or mechanism. The one or more switches also can be a single switch, dual switch, and so forth depending on the power cable configuration, such as the number of conductors. For example, a dual switch can be employed with a power cable having 2-wire, 3-wire or n-wire (where n is a positive integer greater than 1).

In various embodiments, in the fault managed power method and system, the power supply can be a unipolar or bipolar power supply (e.g., power supply (or source), power converter or other power component which can provide negative or positive output voltage).

In other embodiments, the fault managed power method and system also can provide for a calibration process to perform fault detection in an electrical system, such as when different input/system voltage ($V_S$) are allowed. The calibration process can involve the taking of voltage calibration measurement(s) for a reference voltage (e.g., $V_{Ref\_}$Table reference voltage) to produce a calibration table, and scaling the reference voltage for use to perform fault detection. The calibration process can be employed to detect body contact of the cable or other types of fault on an electrical (or power) system, or other types of condition(s) on the electrical system.

These and other example detection methods and systems and features associated therewith of the present disclosure are shown and described in the attached figures.

FIG. 1A illustrates an example of a block diagram of a fault managed power system 100, which employs power cable isolation techniques, in accordance with an embodiment of the present disclosure. The power system 100 includes a power supply 110, a switch $S_1$, an upstream filter 120 such as a low-pass filter, resistors $R_1$ and $R_2$, a switch $S_2$, a capacitor $C_1$, a diode $D_1$, a switch $S_3$, a sensor(s) 140, an isolation switch $S_4$, a current sensor for sensing a current (e.g., $I_{sense}$), a power cable 150, a blocking diode D2, a downstream filter 160 such as a low-pass filter, a power converter 170 such as a DC/DC or DC/AC converter, and a load(s) 180. The power system 100 also can include one or more controllers 190 for controlling the various components of the system 100, and controlling, implementing or causing the various operations and functions described herein. The upstream components between the power supply 110 and the cable 150 can generally be referred to as "source" (or "source circuit"). The component(s) downstream of the cable 150 or between the cable 150 and the load(s) 180 can generally be referred to as "downstream component(s)" or "load-side component(s) or "Fx".

The power supply (or power source) or input power 110 can be an AC or DC power supply. When an AC power supply is employed, the power system 100 can further include a power converter such as AC/DC converter so that DC electrical power is supplied across the cable 150. In various embodiments, when a DC power supply is employed, the power system 100 can further include a power converter such as a DC/DC converter. The power supply/ input power 110 can provide a system voltage $V_S$.

The switch $S_1$ is a switch that is operable to connect or disconnect the power supply 110 to or from components, which are downstream from the source, including the cable

150. The switch $S_1$ can be a mechanical switch or other switch, which can be operated to an open position to disconnect the power supply 110 from such components and to a closed position to connect the power supply to such components. The switch $S_1$ can be operated manually or automatically. In other embodiments, the switch $S_1$ can instead be located in the line side (upstream side) of the AC/DC power source.

The upstream filter 120 and downstream filter 160 can be a low-pass filter, such as a pi-filter (also referred to as π-filter) which may employ LC component(s) (or circuit(s)). The filters 120, 160 can be configured to isolate the cable 150 from source-side/upstream noise and load-side/downstream noise to enable noise-free delivery of DC current/voltage across the cable 150. In this example, the upstream filter 120 can also include freewheeling diode(s) $D_3$ and Zener diode(s) $D_z$, and the downstream filter 160 can include freewheeling diode(s) $D_4$.

The resistors $R_1$ and $R_2$ can be configured to provide a voltage $V_{in}$, which can be a scaled system voltage corresponding to an applied (operating) system voltage for the source circuit. In this example, the voltage $V_{in}$ can equal the $Vs(R2/(R1+R2))$ or the voltage $V_S$ can equal $V_{in}((R1+R2)/R2)$.

The switch $S_2$ can be an electronic switch, which can be operated to rapidly disconnect the supply of power provided by the power supply 110 from the cable 150, and to connect the supply of power provided by the power supply 110 to the cable 150. In this example, the switch $S_2$ can be a solid-state switch.

In various embodiments, a pulse generator (or generating circuitry) can be provided or implemented on or by the source through operation of the switch $S_2$, which can be controlled to generate an electrical pulse(s), such as for example, by turning ON the switch S2 for a short period, e.g., (~500 us) then turning OFF the switch. The pulse generator can be configured to generate an electrical pulse, such as for example a voltage $V_p$ (or current) which can be supplied to the cable 150. In various embodiments, electrical pulses, such as voltage pulses, can be generated to have a pulse frequency within the frequency range which is filtered-out by the filters 120, 160. For example, the frequency can be a high frequency, and the magnitude of the voltage can be sufficiently small (e.g., within a touch-safe range). Furthermore, in some embodiments, the switch $S_2$ can be controlled to generate an electrical pulse(s), such as for example, by turning ON the switch $S_2$ for a short period, e.g., (~500 us) then turning OFF the switch. Although a pulse generator or circuit thereof can be implemented through operation of the switch $S_2$, it should be understood that other pulse generating circuitry may be incorporated into the source to produce an electrical pulse(s) as desired, in accordance with an embodiment.

The switch $S_3$ can be an electronic switch, which can be operated to short-circuit the source or source-side components, to rapidly interrupt and prevent the supply of power from the power supply 110 to the cable 150. In this example, the switch $S_3$ can be a crowbar circuit, which rapidly short-circuits, or in other words crowbars, the supply line, for example, if the voltage and/or current exceeds predefined thresholds.

The sensor(s) 140 can sense or measure electrical energy on the cable 150. The sensor 140 can include an impedance sensor and a frequency selective filter such as a pi-filter. In various embodiments, the impedance sensor in combination with the pi-filter can provide for a tank circuit (also referred to herein as "impedance sensor tank circuit"), which can output an amplified voltage measurement ($V_m$ or $V_{out}$), which can correspond to an impedance difference on the cable 150 or leakage current on the cable 150. The sensor measurement can be used to detect for an occurrence or presence of a fault or fault signal associated therewith (e.g., human body touch or other faults on the cable 150). In this example, the impedance sensor can include a resistor Rd, and a RC circuit (or component), and the filter can be a pi-filter which can include an LC circuit (or component). In this example, the capacitor in the impedance sensor of the sensor 140 and the inductor in the pi-filter can form a tank circuit for tuning into desired frequencies or ranges in order to measure and detect for electrical disturbances such as for example those due to fault signal(s) across the cable 150. In an embodiment, the impedance sensor can work in combination with the pi-filter components, such as primarily the inductor and capacitor closest to the impedance sensor, to provide for the tank circuit.

In various embodiments, the tank circuit can be configured to measure frequency signals in the pulse frequency range of the generated electrical pulses to facilitate detection of electrical disturbances on the power cable.

The switch $S_4$ can be an isolation switch, which can be operated to connect or disconnect the source to or from component(s) (also referred to as circuit(s)) that are downstream from the source. In various embodiments, the switch $S_4$ can be operated to isolate the source circuit from component(s) that are downstream, such as the power cable 150, load(s) and load-side component(s) such as downstream filter and so forth. The source circuit can be isolated, for example, when performing an open circuit test (e.g., testing in an open circuit state) when measuring reference voltages for calibration purposes, such as described herein.

The current sensor can be used to sense a current (e.g., $I_{sense}$) on the cable. The current sensor can be used to detect leakage current or other current signal(s), including fault signal(s), on the cable.

The power cable 150 can be an electrical cable, which can include one or more conductors (e.g., conductors, conductive lines, conductive wires, etc.). In various embodiments, the cable can be 2-wire (twisted) cable, 3-wire (twisted) cable, and so forth. The cable also can be shielded, or unshielded.

The converter 170 can be a power converter such as DC/DC converter or a DC/AC converter. The type of converter can depend on various factors, including the application, load and so forth.

The controller(s) 190 can be configured to implement the various functions and operations as described herein, including but not limited to control of the operation of one or components of the power system 100, to perform or implement of fault detection, and to manage a supply of electrical power/energy from the source to or across the cable 150. The controller(s) 190 can include an internal memory or be communicatively coupled to an external memory. The memory can store among other things, executable instructions or programs for controlling the operations of the controller (including functions and operations described herein), data for use in implementing fault managed power method and system including system variables (e.g., counter, operating parameters, reference tables such as voltage reference tables, etc.), and any other data described herein.

For example, in an embodiment, the controller(s) 190 can be configured to detect for an electrical disturbance on the power cable 150 corresponding to an occurrence of a fault resulting from human body contact with the cable 150 (or its conductive line) or other fault on the cable 150, based on the measurements from the sensor 140, when the electrical pulses or the DC current/voltage and electrical pulses are supplied to the power cable 150, and in response to detection of an occurrence of the fault, interrupting the supply of electrical energy, including the electrical pulses or the DC current/voltage and electrical pulses, to the power cable 150, via at least the at least one upstream switch (e.g., switch $S_1$, $S_2$, $S_3$ and/or $S_4$).

The above-described fault managed power system of FIG. 1 is simply provided as an example. The fault managed power system can be modified, such as to employ one or more switches, upstream and/or downstream power converters, one or more sensors (e.g., impedance sensor(s), current leakage sensor(s) or other sensors to detect fault due to human contact with the cable or other types of faults on the power system), different types of cables and architectures, and so forth. The fault managed power system also can include communication devices, which may be incorporated upstream and downstream of the power cable to implement powerline communication (PLC) across the fault managed power system, or a power distribution system including the fault managed power system.

Figure 1B:
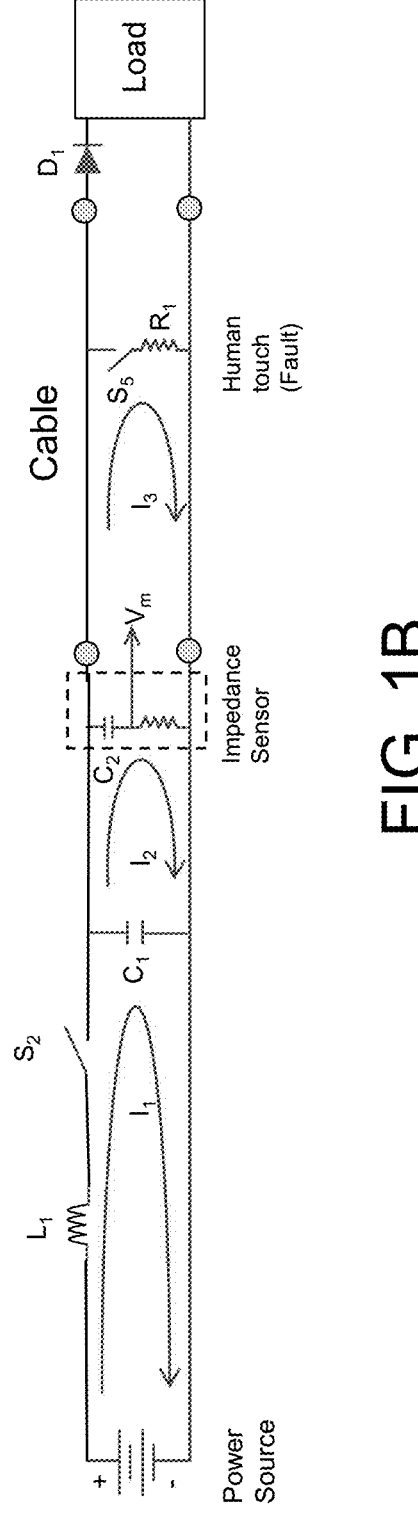
FIG. 1B illustrates a simplified circuit schematic showing an example of a circuit used to measure a fault on the power cable, in accordance with an embodiment of the present disclosure.

FIG. 1B illustrates a simplified circuit schematic showing an example of a circuit used to measure a fault on the cable, in accordance with an embodiment of the present disclosure. This simplified circuit can show the dominant components that can affect transient response waveform detected by the sensor (e.g., 140). Example operations of the simplified circuit, in steady state and during startup, will be described below.

For example, with the switch $S_2$ closed and the system in steady-state, a fault can occur on the cable by closing switch $S_5$ on an equivalent human body resistance $R_1$. Closing switch $S_5$ creates a transient in the entire system. That transient waveform shape (e.g., frequency and magnitude) can be determined primarily from the components $L_1$, $C_1$, and $R_1$. The value of $C_1$ can be the dominant component controlling the peak voltage, $V_m$, as measured by the impedance sensor. Both $L_1$ and $C_1$ can be the dominant components driving the frequency of oscillation. The impedance sensor can act as a voltage divider measuring the transient voltage developed by the fault.

Figure 1C:
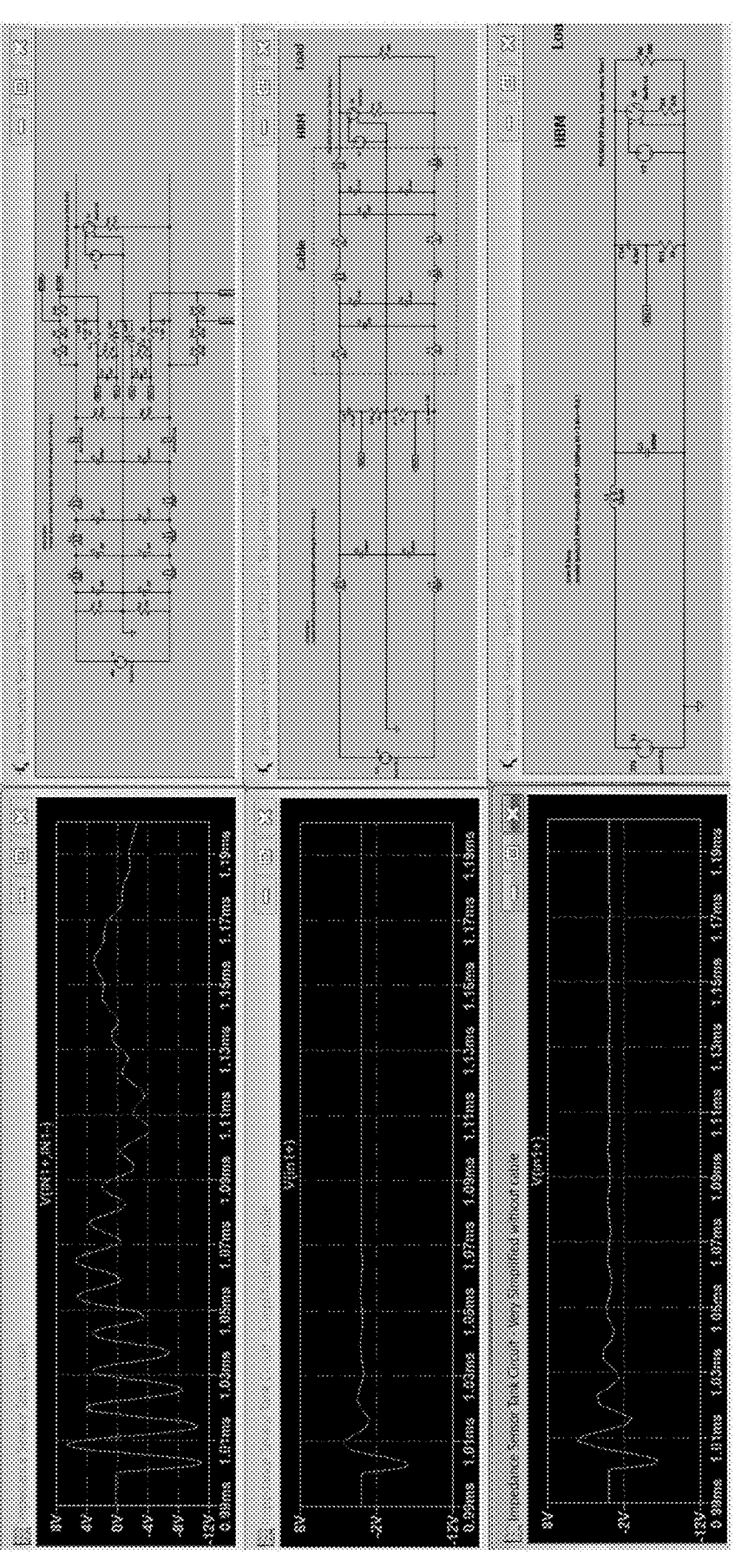
FIG. 1C illustrates waveforms from SPICE models showing changes in wave-shape with simplification of the circuit to determine and illustrate the dominant components which are used to detect faults on the power cable.

During the startup phase, the voltage across $C_2$ can be measured to determine if a fault exists on the cable prior to applying the full system voltage. Switch $S_2$ can be closed momentarily (e.g. 300 to 500 μs micro-second) to charge $C_1$ and any other capacitance (e.g. load, cable, etc.) in the system. The decay rate (e.g., voltage across $C_1$) of $C_1$ can be measured. If this rate of decay exceeds a threshold, then $S_2$ remains open for a predetermined time. After this time, the process can be repeated. If the rate of decay still exceeds limits after a third attempt, then the system can be locked out indicating a permanent fault. If the decay rate is within limits, then the switch $S_2$ can be closed, and current will flow to the load. Diode $D_1$ can be optional but is preferred. One of its purposes is to block any stored energy on the load side from slowing the discharge rate of the impedance sensor capacitor $C_2$. A slower discharge of $C_2$ can result in longer detection time which may not meet desired response time requirements but may be acceptable for some applications. The cable impedance also can affect the measurement of the waveform but is not as dominate as the components shown in FIG. 1C. For example, FIG. 1C illustrates waveforms from SPICE models showing changes in wave-shape with simplification of the circuit to determine and illustrate the dominant components which are used to detect faults on the cable. The first or second peak is important since it can be used to determine fault on the cable.

Figure 1D:
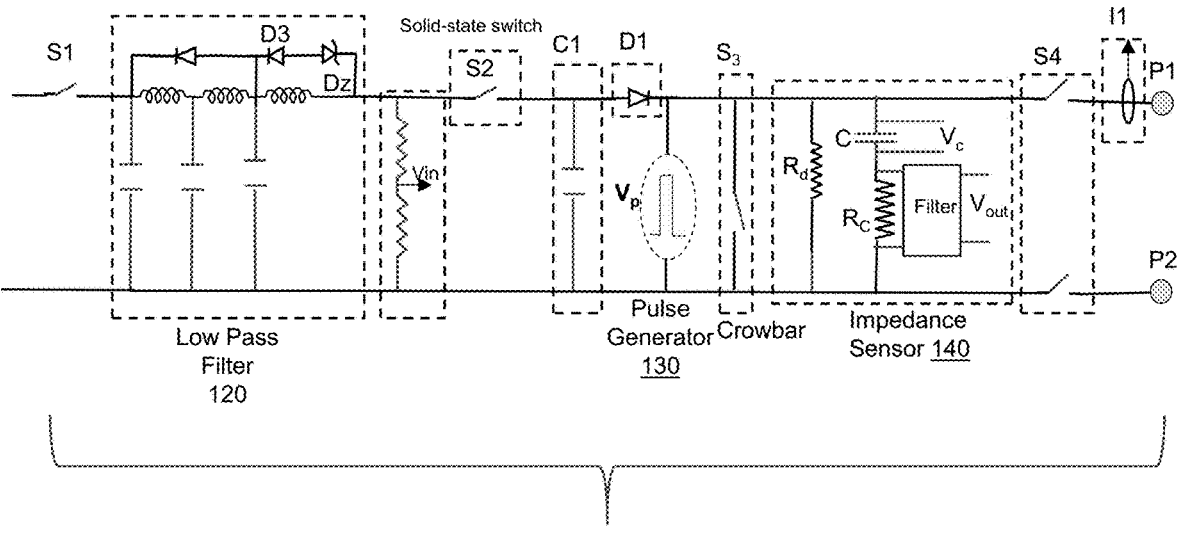
FIG. 1D illustrates an example of the source (or transmitter) of the fault managed power system of FIG. 1A with the switches in the open position, in accordance with an embodiment of the present disclosure.

FIG. 1D illustrates the Source (or Transmitter) of the block diagram of a fault managed power system 100 of FIG. 1A with the switches (e.g., $S_1$, $S_2$, $S_3$ and $S_4$) in the open position, in accordance with an embodiment of the present disclosure. As shown in this example, the Source at P1, P2 is disconnected or is not connected to downstream components (e.g., cable, load-side components, etc.) via open switch $S_4$.

Figure 2:
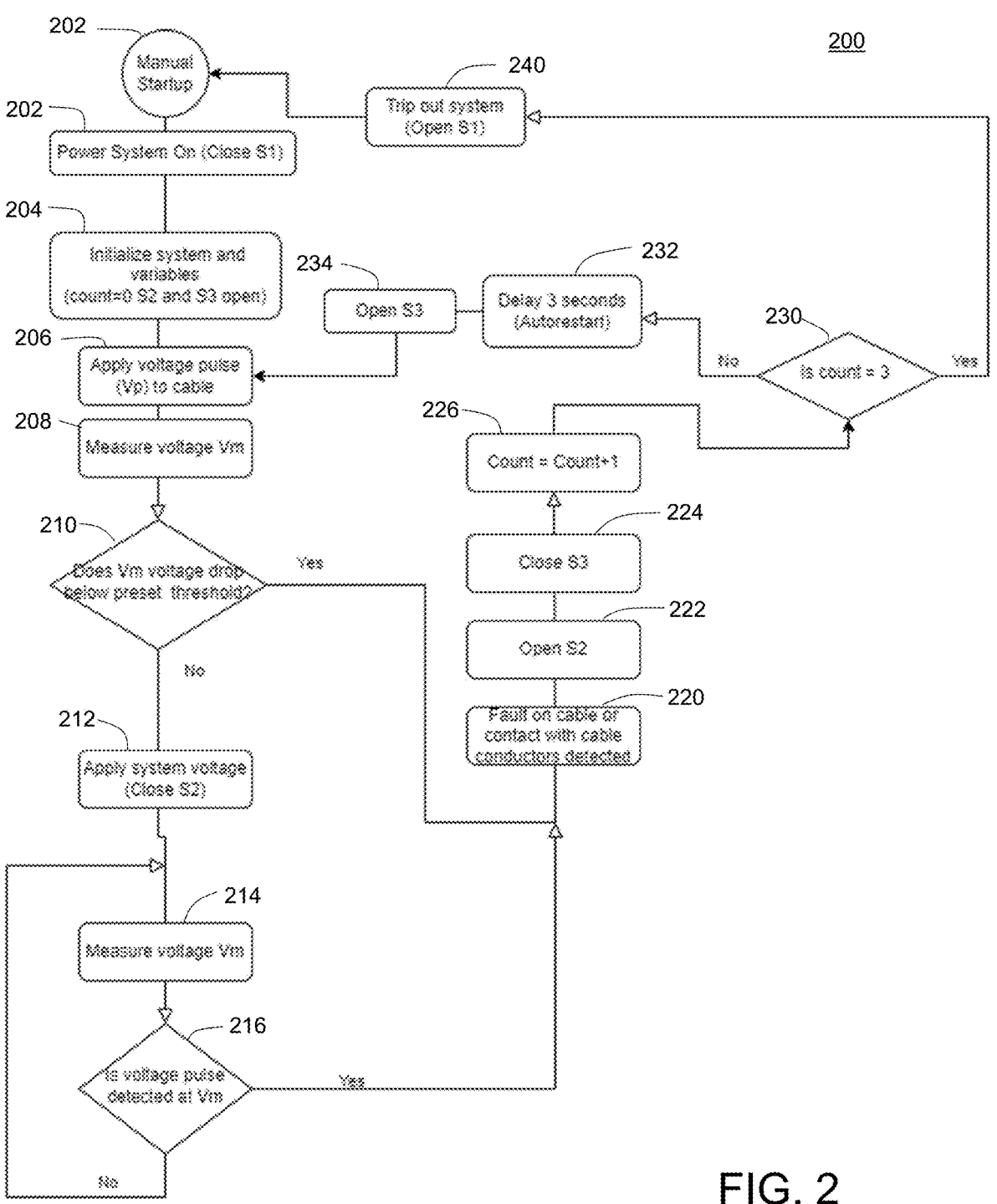
FIG. 2 illustrates an example process of operating a fault managed power system or components thereof, which employ power cable isolation techniques, in accordance with an embodiment of the present disclosure.

FIG. 2 illustrates an example process 200 of operating fault managed power system or components thereof, which can employ power cable isolation techniques, in accordance with an embodiment of the present disclosure. By way of example explanation, the process 200 will be described with reference to the exemplary fault managed power system 100 (or components thereof) of FIG. 1. The various operations of the process 200 may be performed by or under control of one or more controllers.

The process 200 begins at block 202 in which manual start-up of a fault managed power system (e.g., 100) is initiated.

At block 202, the fault managed power system can be turned ON to enable or initiate power supply operations to supply of power from a power supply to the power cable and its line conductor(s). For example, the switch S1 can be closed. The power source can be a DC regulated power source. In various embodiments, an upstream power converter (e.g., AC/DC converter, DC/DC converter) also can be employed to supply desired DC power (e.g., DC current or voltage ("DC current/voltage")) to downstream components.

At block 204, the fault managed power system can be initialized, and system variable(s) also can be initialized. For example, the switches S2 and S3 can be opened, and a variable COUNT can be set to zero (e.g., a counter is set to zero or a default value).

At block 206, an electrical pulse(s) (or pulse signal(s)) can be applied to the power cable by momentarily closing switch S2, at the start-up stage. For example, a voltage pulse having, for example, a magnitude of $V_p$, can be applied to the power cable. In various embodiments, the pulse output has a rise-time which is within the frequency range which is filtered out (e.g., blocked) by the upstream and downstream filters.

At block 208, electrical property of the power cable is measured. For example, a voltage (e.g., $V_m$ or $V_{out}$) is measured by a sensor (e.g., 140). The measured voltage can correspond to impedance change or differences on the power cable or leakage current on the cable, which may reflect electrical disturbances on the power cable.

At block 210, a determination is made whether the measured electrical property satisfies a preset threshold (or condition). For example, a determination can be made whether the measured voltage $V_m$ or $V_{out}$ by the sensor, such as an impedance sensor, drops below a preset threshold. If the measured voltage drops below the preset threshold, the process 200 proceeds to block 220 which will be discussed further below. Otherwise, if the measured electrical property does not satisfy the preset threshold, at block 212, system voltage (e.g., DC voltage) is applied, such as for example by closing switch S2, to initiate steady state operation of the power system. For example, the applied system voltage from the power supply has been filtered, e.g., passes through the upstream filter, e.g., a low-pass filter, to isolate the cable from any noise or signals (e.g., high frequency signals) originating upstream of the cable.

At block 214, electrical property of the power cable is measured. For example, voltage ($V_m$ or $V_{out}$) is measured by the sensor, such as for example, an impedance sensor which is influenced by the nearest LC component(s) of a pi-filter or an impedance sensor tank circuit. The measured voltage can correspond to an impedance change or differences on the power cable, or leakage current or other current on the cable.

At block 216, a determination is made whether a voltage pulse is detected from the measurement by the sensor (e.g., detected at $V_m$ or $V_{out}$). If not, the process 200 proceeds back to block 214. Otherwise, if a voltage pulse is detected, at block 220, a fault (or signal thereof) is detected on the cable, e.g., contact (e.g., human body contact) with the cable or other fault on the cable is detected.

At block 222, the switch S2 is opened to disconnect system voltage, and the switch S3 is closed at block 224 to create a short-circuit which discharges any stored energy that could flow into the fault and clamps the voltage across the power cable to a safe level within a prescribed time.

At block 226, the counter is incremented. In this example, the counter is increment by one (e.g., Count=Count+1).

At block 230, a determination is made on whether the counter has reached a count threshold, which may be preset (or predefined) count. In this example, the count threshold is 3. The count threshold can be configured or set to a number, which can address among other things false positives or nuisance tripping or depend on other factors. If the count has not reached the count threshold (e.g., Count=3), the process 200 proceeds to block 232 in which a preset delay is applied before restarting (e.g., delay 3 seconds (Auto-restart). At block 234, the switch S3 is opened to discontinue the short-circuit, and to enable supply of power to the cable. The process 200 then proceeds back to block 206 to continue detection for an occurrence of body contact (e.g., human body contact with a conductor or conductive line of the cable, etc.) or other fault associated with the cable.

Turning back to block 230, if the count threshold is reached (or satisfied), the system is tripped out at block 240. For example, a tripping operation can be performed by opening switch S1 to stop or disconnect a supply of power from the power supply to the cable, and the power supply operation of the power system is stopped or terminated. Thereafter, the process 200 can proceed back to 202 to enable manual start-up of the power system.

The above process 200 is provided as an example. The process 200 can be adapted for implementation on different power system architectures, including those described herein, which may include one or more line conductors or one or more switches or the like for enabling or interrupting power supply across the line conductor(s) of a power cable.

Figure 3A:
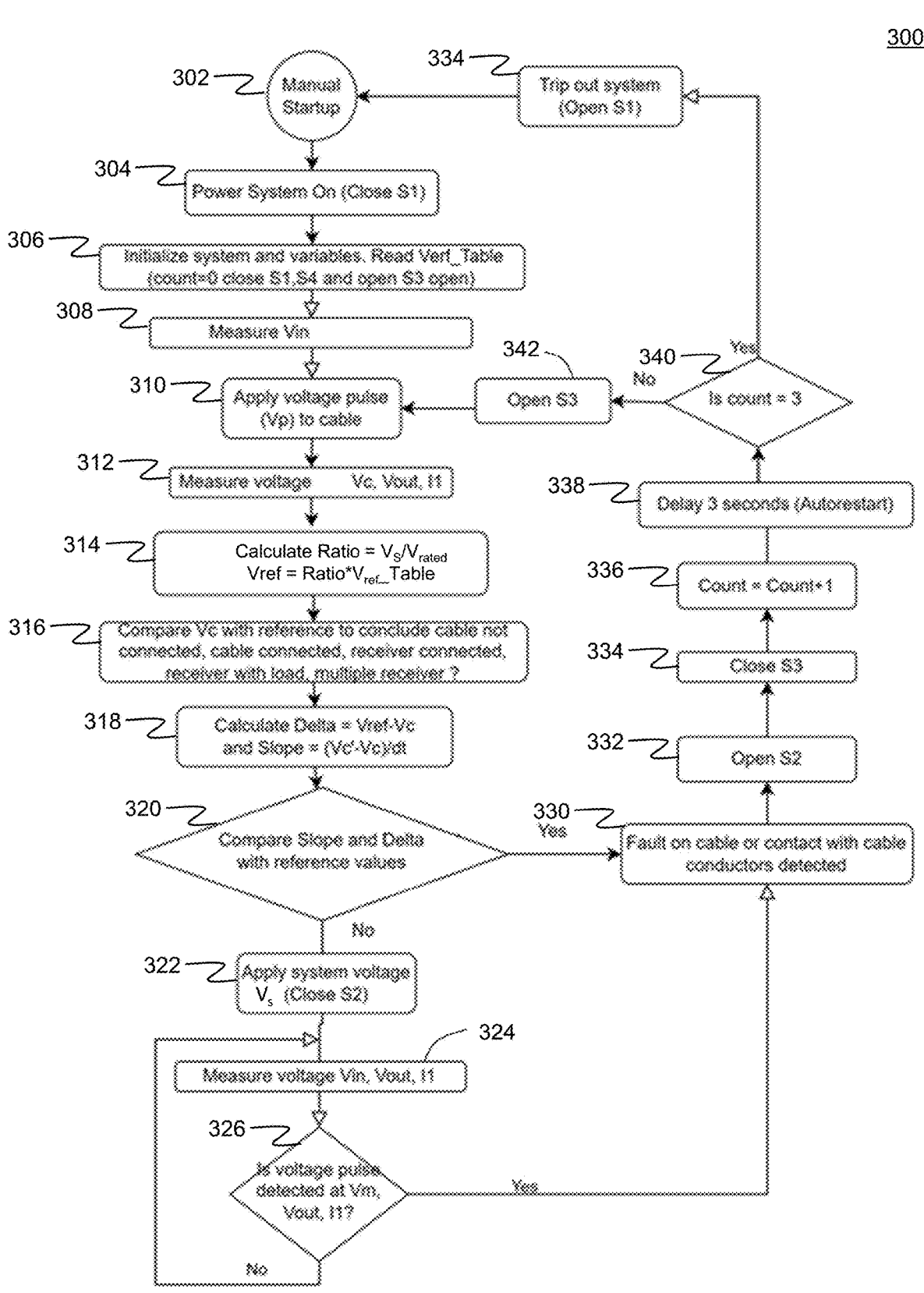
FIG. 3A illustrates an example process of operating a fault managed power system or components thereof, which employ power cable isolation techniques with probing pulse measurement during turn ON, in accordance with an embodiment of the present disclosure.

FIG. 3A illustrates an example process 300 of operating a fault managed power system or components thereof, which can employ power cable isolation techniques and a calibration process, in accordance with an embodiment of the present disclosure. By way of example explanation, the process 300 will be described with reference to the exemplary fault managed power system 100 (or components thereof) of FIG. 1. The various operations of the process 300 may be performed by or under control of one or more controllers.

The process 300 begins at block 302 in which manual start-up of a fault managed power system (e.g., 100) is initiated.

At block 304, the fault managed power system can be turned ON to enable or initiate power supply operations to supply power from a power supply to the power cable and its line conductor(s). For example, the switch $S_1$ can be closed. The power source can be a DC regulated power source. In various embodiments, an upstream power converter (e.g., AC/DC converter, DC/DC converter) also can be employed to supply desired DC power (e.g., DC current or voltage ("DC current/voltage")) to downstream components.

At block 306, the fault managed power system can be initialized, and system variable(s) also can be initialized. For example, the switches $S_1$ and $S_4$ are closed, the switch $S_3$ are open, and a variable COUNT can be set to zero (e.g., a counter is set to zero or a default value).

The fault managed power system also can access or read the voltage calibration measurement reference table (e.g., $V_{ref}$_Table). Vref_Table can be generated by making $S_2$ switch ON for a time period (e.g., 1 second) then immediately starting measurement of the voltage across the power cable (e.g., across point P1 and P2 in FIG. 1A) with a time interval Tdelta, which can be predefined. This voltage can be referred to as Vref_Table reference voltage.

Vref_Table =

$\{V\_Ref1, V\_Ref2, V\_Ref3, V\_Ref4, V\_Ref5, \ldots \ldots, V\_Refn\},$ where n is the number of calibration measurements in the calibration table $V_{Ref}$_Table. An example of the calibration process for generating voltage calibration measurement reference table(s) is described further below in the example of FIG. 3B, and can generate positive and negative reference voltages.

During this voltage calibration measurement, the downstream component(s)/circuit(s) such as load and cable are disconnected from the source. This is an open circuit test of the source circuit. These measured values are stored in software as constants such as in a calibration Table and referred to as $V_{Ref}$ variable. In normal operation, first the switch $S_2$ is closed for a period of time (e.g., 500 us), which generates a voltage pulse across the capacitor C ($V_C$). The voltage across the capacitor C is measured with Tdelta time delay, and each value of the voltage $V_C$ can then be used to calculate Delta and Slope described further below in detail. An example of sample data of the calibration table $V_{Ref}$_Table is provided in FIG. 20.

At block 308, the fault managed power system can measure various electrical properties, such various current and voltage measurements, in the system. In this example, the measurements can include the voltage $V_{in}$, where $V_{in}$ is the input voltage (e.g., inputted system voltage). In various embodiments, the Vin level can be checked and if it is within a desired predefined limit then the process 300 can move forward (otherwise the process 300 may keep waiting).

At block 310, an electrical pulse(s) (or pulse signal(s)) can be applied to the power cable by momentarily closing switch S2, at the start-up stage. For example, a voltage pulse having, for example, a magnitude of $V_p$, can be applied to the power cable. In various embodiments, the pulse output has a rise-time which is within the frequency range which is filtered out (e.g., blocked) by the upstream and downstream filters.

At block 312, the fault managed power system can measure various electrical properties, such various current and voltage measurements. In this example, the measurements can include the voltages $V_C$, and $V_{out}$, and the current $I_1$, where $V_C$ is the voltage across a capacitor of the sensor, $V_{out}$ is a voltage measured by the sensor or tank circuit of the sensor, and $I_1$ is a current measured through the cable (e.g., $I_{sense}$).

For example, the voltage (e.g., $V_{out}$ or $V_m$) can be measured by the sensor (e.g., 140). The measured voltage can correspond to impedance change or differences on the power cable or leakage current on the cable, which may reflect electrical disturbances on the power cable.

At block 314, the fault managed power system calculates various ratios for use in scaling the calibration measurements, such as for example $V_{Ref}$_Table. Since different system input voltage ($V_S$) may be allowable, but limited to an upper and lower limit, the $V_{Ref}$_Table voltage may need to be scaled so that all table reference values are scaled for a system voltage that is different from the voltage used for calibration. The voltage Vrated is a system voltage at which voltage references from the calibration table $V_{Ref}$_Table were recorded.

For example, the fault managed power system calculates a Ratio between the applied system voltage ($V_s$) and the voltage at which the system was calibrated ($V_{rated}$) to obtain a value $V_{ref}$ such as using the following example equations:

$$\text{Ratio} = V_s/V_{rated}; \text{ and}$$

$$V_{Ref} = \text{Ratio} * V_{Ref}\_\text{Table},$$

where:

Vs is an applied open circuit system voltage,

Vin=Vs(R2/(R1+R2)) is a scaled system voltage $V_S$, and $V_{rated}$ is a system voltage at which voltage references from the calibration table $V_{Ref}$_Table were recorded.

In general, the voltage Vin can be the system voltage $V_S$, which is scaled by a resistor divider ratio (e.g., R2/(R1+R2)) in the example of FIG. 1).

At block 316, the fault managed power system compares the measured voltage $V_C$ with a reference (e.g., threshold) to determine a connection status of the cable in the system. The status (or condition) can include, but is not limited to, whether the cable is (or is not) connected, load-side (or Fx) component(s) is (or is not) connected, load-side (or Fx) component(s) and load are connected, a presence of multiple/groups of load-side (or Fx) component(s) and/or loads, etc. The determined nature of the connection status may be used to configure, change or determine threshold(s) or values thereof to be employed, or to trigger some other action. In various embodiments, the measured voltage Vm during the applied pulse during startup can be used to determine if the cable and downstream hardware are connected.

At block 318, the fault managed power system calculates a difference between the scaled reference voltage $V_{Ref}$ and the voltage across the capacitor $V_C$, the difference of which is referred to as Delta. The fault managed power system also calculates a change over a time (or a period of time) of the voltage across the capacitor which is referred to as Slope. Example equations for Delta and Slope are provided as follows:

$$\text{Ratio} = V_s/V_{rated};$$

$$V_{ref[i]} = \text{Ratio} * V_{ref}\_\text{Table}[i];$$

-continued $$\text{Delta} = V_{ref}[i] - V_C[i]; \text{ and}$$

$$\text{Slope} = (V_C[i-1] - V_C[i])/dt,$$

where:

$V_{rated}$ is the system voltage at which the voltage reference table (e.g. FIG. 20) was created for calibration, $V_{in}$ is the scaled steady-state system input voltage, Vs, under the open circuit condition (i.e. S2 open), $V_{ref}$_Table[i] is a calibration table of the plurality of measurements of reference voltages (V_Ref1, V_Ref2, V_Ref3, V_Ref4, V_Ref5, . . . , V_Refn), $V_{Ref}[i]$ is a scaled reference voltage of an ith reference voltage from the calibration table $V_{ref}$_Table, dt is $T_{delta}$ which is a step time or time interval, $V_C$ is a voltage measured across the capacitor of the impedance sensor, Delta is the difference, and Slope is the voltage change over time, and i=1 to n (where n can be the number of voltage calibration measurements in the calibration table $V_{Ref}$_Table).

At block 320, the fault managed power system determines a presence (or not) of an electrical disturbance on the power cable corresponding to an occurrence of a fault resulting from body contact with the cable (e.g., human body contact with a conductor or conductive line of the cable) or other fault on the cable. For example, the fault managed power system can compare the Slope and Delta with reference values (e.g., thresholds or values thereof). In the event that the Slope and Delta exceeds respective reference values, a fault is detected. The thresholds can be scaled thresholds, which may be scaled in relation to the ratio of current system voltage ($V_{in}$) and calibration system voltage ($V_{rated}$).

If the Slope and Delta exceeds the reference values, the process 300 proceeds to block 330 which will be discussed further below. Otherwise, if the Slope and Delta do not exceed the reference values, at block 322, system voltage (e.g., DC voltage) is applied, such as for example by closing switch S2, to initiate steady state operation of the power system. For example, the applied system voltage from the power supply has been filtered, e.g., passes through upstream filter, e.g., a low-pass filter, to isolate the cable from any noise or signals (e.g., high frequency signals) originating upstream of the cable.

At block 324, electrical properties of the source and power cable are measured, such as voltage $V_{in}$ and voltage $V_{out}$ by voltage sensors and current $I_1$ (or $I_{sense}$) by a current sensor.

At block 326, a determination is made whether a voltage pulse is detected at $V_m$, $V_{out}$. If a voltage pulse is not detected, the process 300 proceeds back to block 324 for further measurement and evaluation of the electrical properties. Otherwise, if a voltage pulse is detected, at block 326, body contact (e.g., human body contact) with the cable (or its conductive line) or other fault is detected on the cable at block 330.

At block 332, the switch S2 is opened to disconnect the system voltage. At block 334, the switch S3 is closed to create a short-circuit which discharges any stored energy that could flow into the fault and clamps the voltage across the power cable to a safe level within a prescribed time.

At block 336, the counter is incremented. In this example, the counter is increment by one (e.g., Count=Count+1).

At block 338, a delay is provided, such as for example at or around 3 seconds (e.g., a preset delay before auto-restart).

At block 340, a determination is made on whether the counter has reached a count threshold, which may be preset (or predefined). In this example, the count threshold is 3. The count threshold can be configured or set to a number, which can address among other things false positives or nuisance tripping or depend on other factors. If the count has not reached the count threshold (e.g., Count=3), the process 300 proceeds to block 342 at which the switch S3 is opened to discontinue the short-circuit, and to enable supply of power to the cable. The process 300 then proceeds back to block 206 to continue detection for an occurrence of any body contact (e.g., human body contact with a conductor or conductive line of the cable, etc.) or other fault associated with the cable.

Turning back to block 340, if the count threshold is reached, the system is tripped out. For example, a tripping operation is performed by opening switch S1 to stop or disconnect a supply of power from the power supply to the cable, and the power supply operation of the power system is stopped or terminated. Thereafter, the process 300 can proceed back to 302 to enable manual start-up of the power system.

The above process 300 is provided as an example. The process 300 can be adapted for implementation on different power system architectures, including those described herein, which may include one or more line conductors or one or more switches or the like for enabling or interrupting power supply across the line conductor(s) of a power cable.

Figure 3B:
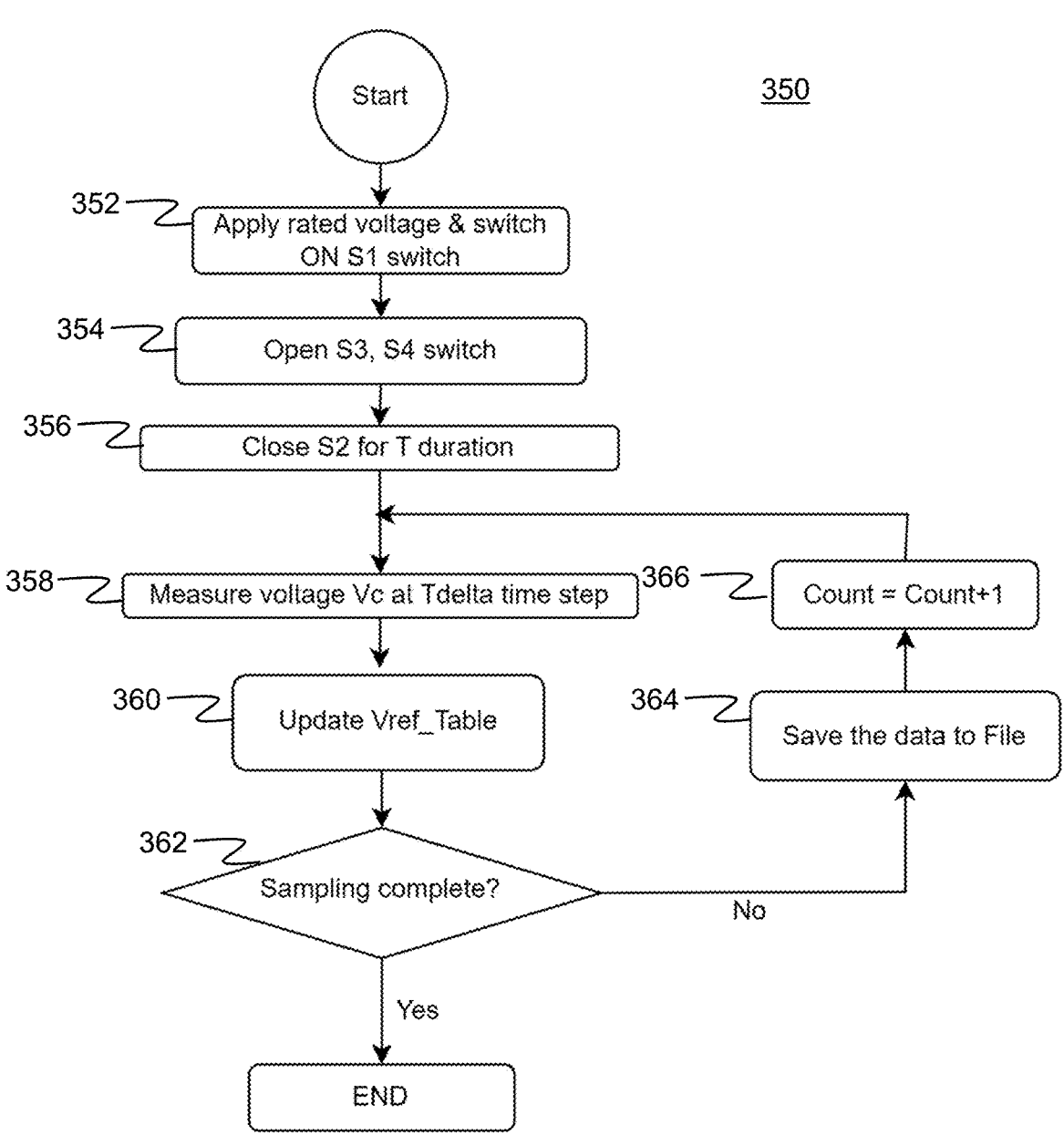
FIG. 3B illustrates an example calibration process of generating a voltage reference table(s) (e.g., $Vr_{ef}$_Table), in accordance with an embodiment of the present disclosure.

FIG. 3B illustrates an example calibration process 350 of generating a voltage reference table(s) (e.g., $Vr_{ef}$_Table), in accordance with an embodiment of the present disclosure. For the purposes of explanation, the process 350 will be described with reference to the Source (or Source Module/ Circuit) of FIG. 1D. In this example process 350, no load is connected to the Source module at P1, P2; an accurate rated Voltage can be applied at the input; and a separate table of reference voltage (e.g., Vref_Table) can be created for +Ve (positive voltage) and −Ve (negative voltage) power supplies. An example of such separate tables (and sample data thereof) are shown in FIG. 20. The various operations of the process 350 can be implemented by or under control of one or more controllers.

The process 350 begins at block 352 in which a rated Voltage is applied at the input and the switch $S_1$ is switched ON to a closed position to connect the Source to the input power.

At block 354, the switches $S_3$ and $S_4$ are placed in the open position.

At block 356, the switch $S_2$ is closed for a time period, such as a T duration. T duration is a time which can be considered where the voltage settles down (e.g., one (1) second).

At block 358, voltage $V_C$ is measured at Tdelta time step, such as using a voltage or other suitable sensor(s).

At block 360, the voltage reference table (e.g., $V_{ref}$_Table) is updated with the voltage measurement.

At block 362, a determination is made on whether sampling is complete. For example, a number of samples (e.g., Count) may be compared to a threshold (or limit) to ascertain whether a sufficient number of samples have been collected.

If sampling is complete (e.g., the number of samples is equal to or reaches the threshold (or limit)), the process 350 terminates. Otherwise, the process 350 proceeds to block 364 in which the data, such as the reference voltage measurement(s) or table(s) thereof, is saved to a file. At block 366, a counter is incremented, e.g., Count=Count+1. The value of Count may be set or initialized to zero at the start of the process 350 or when no samples have been collected and saved. Thereafter, the process 350 returns to block 358 to continue to take sample measurements of the voltage $V_C$ until the sampling is determined to be complete.

An example of a voltage reference (Vref) Table(s), also referred to as a calibration Table(s), is shown in FIG. 20, which is described in further detail further below. The calibration table can include a table or array of positive reference voltages and a table or array of negative reference voltages.

FIG. 4A illustrates an example process 400 of operating a fault managed power system or components thereof, which can employ power cable isolation techniques, in accordance with an embodiment of the present disclosure. By way of example explanations, the process 400 will be described with reference to the exemplary fault managed power system 100 (or components thereof) of FIG. 1, such as a source/source circuit, a downstream component(s) (or circuit(s)) and a power cable for delivering electrical energy from the source to the downstream component(s) (or circuit(s)). The power cable can include at least one electrically conductive line. The various operations of the process 400 may be performed by or under control of one or more controllers.

The process 400 begins at block 402 in which the power cable is isolated from upstream noise or signals using an upstream low-pass filter of the source. For example, the upstream low-pass filter can be connected between an electrical power supply and the power cable.

At block 404, the power cable is isolated from downstream noise or signals using a downstream low-pass filter of the downstream component(s).

At block 406, electrical energy, including electrical pulse(s) or DC current/voltage along with the electrical pulse(s), is supplied from the source to the power cable. For example, the electrical pulses can be generated by operation of a switch (as described herein) or other pulse generation circuitry of the source. The electrical energy can be selectively supplied by the source to the power cable. For example, the source can selectively supply the electrical pulses and/or the DC current/voltage and electrical pulses to the power cable. In various embodiments, the source can supply the electrical pulse(s) during a start-up stage before enabling supply of the DC current/voltage or supply the DC current/voltage along with the electrical pulse(s) during steady state operation of the power system.

At block 408, electrical activity related to the electrical pulse(s) is measured on the power cable using an impedance sensor of the source. The impedance sensor can be arranged between a pulse generator/pulse generating circuit (or component) and the power cable. In various embodiments, additional sensors such as leak current sensor(s) can be employed to measure electrical activity on the power cable.

At block 410, an occurrence of an electrical disturbance on the cable, which corresponds to an occurrence of a fault resulting from body contact with the power cable (or its conductive line) is detected (e.g., detected, determined, identified, etc.), based on the measurements from a sensor or an impedance sensor tank circuit of the sensor, when the electrical pulses or the DC current/voltage along with the electrical pulses are supplied to the power cable.

At block 412, in response to detection of the occurrence of the fault, the supply of electrical energy from the source to the power cable is interrupted (or prevented), via at least one upstream switch.

The above process 400 is provided as an example. The process 400 can be adapted for implementation on different power system architectures, including those described herein, which may include one or more line conductors or one or more switches or the like for enabling or interrupting power supply across the line conductor(s) of a power cable.

FIG. 4B illustrates an example calibration process 450 for use in a detection system of an electrical or power system, in accordance with an embodiment of the present disclosure. By way of example explanations, the process 450 will be described with reference to the exemplary fault managed power system 100 (or components thereof) of FIG. 1, such as a source/source circuit, a downstream component(s)/ circuit(s) and a power cable for delivering electrical energy from the source to the downstream component(s). The power cable can include at least one electrically conductive line. The various operations of the process 450 may be performed by or under control of one or more controllers.

At block 452, the system measures using a sensor a reference voltage across the source circuit in the open circuit state for a predefined time period when a first system voltage (e.g., $V_{rated}$, etc.) for calibration is applied to the source circuit. The reference voltage is a voltage to be supplied from the source circuit to downstream component(s) connectable thereto. A plurality of measurements of the reference voltage are taken by the sensor over time and stored in a memory. For example, the plurality of measurements of the reference voltage can be stored in a calibration table (e.g., $V_{Ref}$_Table).

In various embodiments, the sensor can be or include an impedance sensor with RC component(s). The sensor also can include a filter with an LC component(s), which together with the RC component(s), can provide for a tank circuit. The sensor can provide for voltage measurements, such as across a capacitor of the RC component(s) of the sensor.

At block 454, the system measures using the sensor a voltage across the source circuit in the open-circuit state (also referred to as "open circuit") for the predefined time period when a second system voltage (e.g., $V_s$, etc.), which is different than the first system voltage, is applied to the source circuit.

At block 456, the system scales, in relation to the second system voltage, a reference voltage from the plurality of measurements of reference voltage according to a ratio between the second system voltage and the first system voltage to provide a scaled reference voltage.

At block 458, the system calculates a difference between the scaled reference voltage and the voltage measured across the source circuit by the sensor at the second system voltage (e.g., Delta).

At block 460, the system calculates a voltage change over time between a prior voltage and the voltage measured by the sensor over the predefined time period at the second system voltage (e.g., Slope).

At block 462, the system compares the difference and the voltage change over time to respective thresholds. The thresholds can be scaled thresholds, which can be scaled according to the ratio between the second system voltage and the first system voltage to provide a scaled reference voltage.

In various embodiments, the system can also detect for a type of circuit configuration of the downstream circuit (connectable to the source circuit), and configure the thresholds according to the detected configuration of the downstream circuit. The type of circuit configuration can include a single load, a plurality of loads, or the other circuit configurations described herein.

At block 464, the system, in response to the comparison, determines whether a condition on the electrical system has occurred or not. The condition can include but is not limited to body contact of the power cable (e.g., human or other body contact of a conductor of the power cable) or other faults on the power cable (e.g., arc fault, ground fault, etc.) including those described herein.

The calibration process 450 can be employed with a fault managed power system (e.g., 100) such as described herein or with other types of detection systems for detecting different kinds of conditions on an electrical (or power) system, including those described herein. Furthermore, the calibration process 450 can be employed in combination with other detection processes, such as described herein, to detect for a fault(s) on a cable or other conditions on the cable or electrical/power system. The process 450 also can be adapted for implementation on different power system architectures, including those described herein, which may include one or more line conductors or one or more switches or the like for enabling or interrupting power supply across the line conductor(s) of a power cable.

Figure 5A:
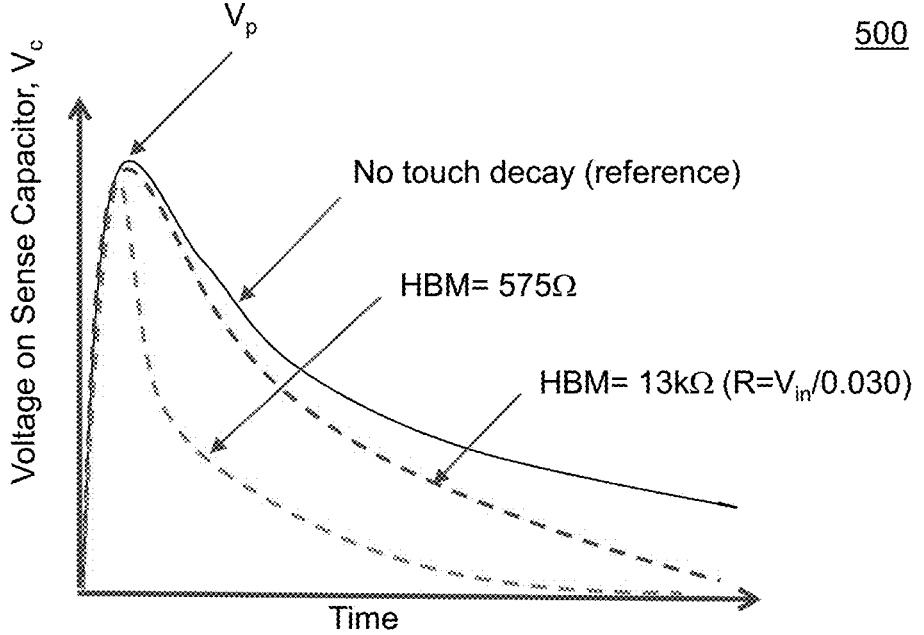
FIG. 5A illustrates an example of a graph showing the voltage, as sensed, across a conductor(s), such as a power cable, over time, in relation to human body model in accordance with an embodiment of the present disclosure.
Figure 5B:
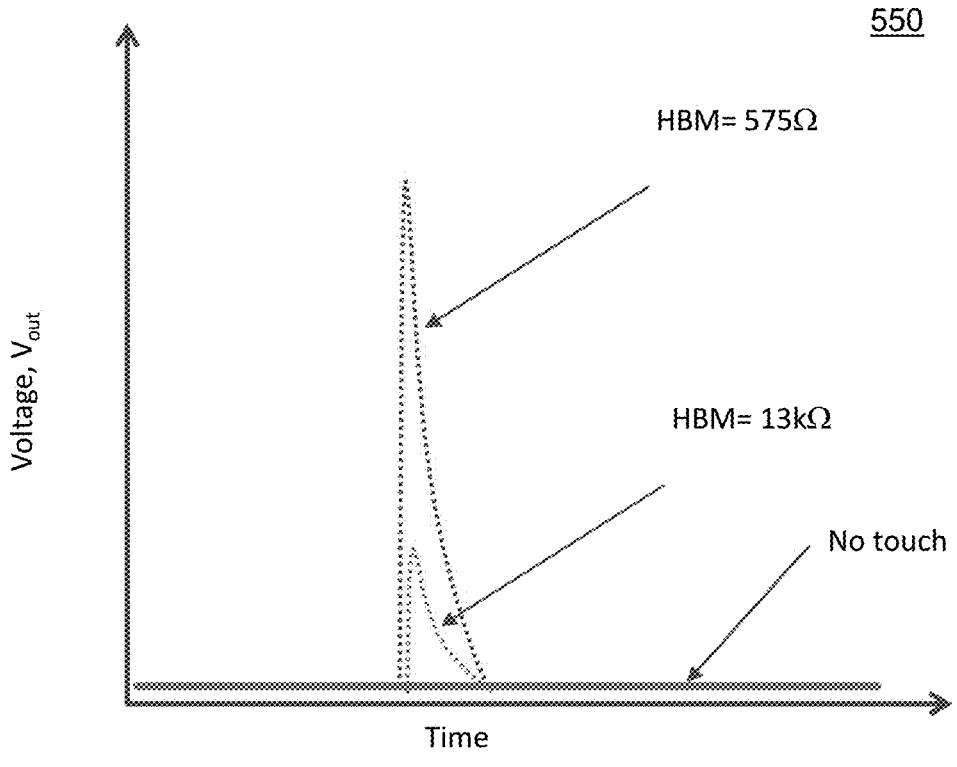
FIG. 5B illustrates an example of a graph showing the voltage, as sensed, across a conductor(s), such as a power cable, over time, in relation to human body model in accordance with an embodiment of the present disclosure.

FIG. 5A illustrates an example of a graph 500 showing the voltage, as sensed, across a conductor(s), such as a power cable, over time, in relation to human body models (HBMs) in accordance with an embodiment of the present disclosure. In this example, the voltage Vc can be the voltage of a sense capacitor (e.g., the capacitor of the impedance sensor 140 of FIG. 1) in relation to a start-up stage. Similarly, FIG. 5B illustrates an example of a graph 550 showing the voltage, as sensed, across a conductor(s), such as a power cable, over time, in relation to a human body models (HBMs) in accordance with an embodiment of the present disclosure. In this example, the voltage Vout can be the outputted voltage from a sensor (e.g., the impedance sensor tank circuit of FIG. 1) in relation to a steady state operation stage.

On the graphs 500 of FIG. 5A and 550 of FIG. 5B, there is shown sensed voltage profiles of different human body models (e.g., different resistances) which can reflect different types of human body contact with the cable, e.g., body part in contact with the cable, amount of body contact to the cable, line-to-line human body contact, line-to-ground human body contact, etc. HBMs can be predetermined for different human body contact scenarios, including no touch/ contact scenario. The HBMs can be used as a proxy for actual human testing to test the detection of a fault, such as human contact with the cable, based on measurements of electrical properties of the monitored cable. Other voltage models also may be employed to detect for other types of faults on a power cable, based on sensor measurements.

For example, a DC fault managed power system can employ filters at both source and load (or Fx) sides, such as described herein, which in turn can provide "noise free" DC voltage or current on an interconnecting electrical cable. The introduction of a fault (e.g., human body contact, etc.) can create a disturbance pulse that can be measured by a sensor. The sensor can output a voltage or other electrical measurement, which can correspond to a change of impedance on the monitored cable or to leakage current on the monitored cable. For instance, the peak of the pulse can be proportional to the leakage current. The presence of a pulse at Vc or Vout can indicate human body contact on one or more conductors of a cable connecting the source-side/upstream and load-side/downstream filters. The filters can be low-pass filters such as x-filters, or other low-pass filters for filtering out noise such as high frequency noise or signals. In response to detection of the occurrence of such a fault, the fault managed power system can interrupt or prevent supply of power (e.g., voltage, current, etc.) across the cable, using switches (or the like). In various embodiments, fast switching off and crowbarring can allow a fault managed power system to satisfy shock/fire requirements for a Class 4 power system and other safety requirements.

FIGS. 6 through 10 illustrate various power distribution architectures, which may employ the fault managed power method and system as described herein. In general, these various architectures include one or more sources, one or more downstream components (load-side components or Fxs), and one or more power cables connected between source(s) and load-side component(s). As described herein, the source and the downstream component(s) can include upstream and downstream filters to isolate the cable from noise (e.g., filter out any noise in desired frequency ranges from the upstream power supply and the downstream load(s)), and the source can include a pulse generation circuitry and impedance sensor to measure electrical activity on the power cable. The measurements from the sensor can be used, for example, by a controller(s), to detect an occurrence of a fault, such as human body contact with the cable or other fault. In response to detection of an occurrence of a fault, electrical energy supplied to one or more power cables is interrupted (or prevented) using one or more switches. These example architectures are described in further detail below.

Figures 6, 7, 8, 9:
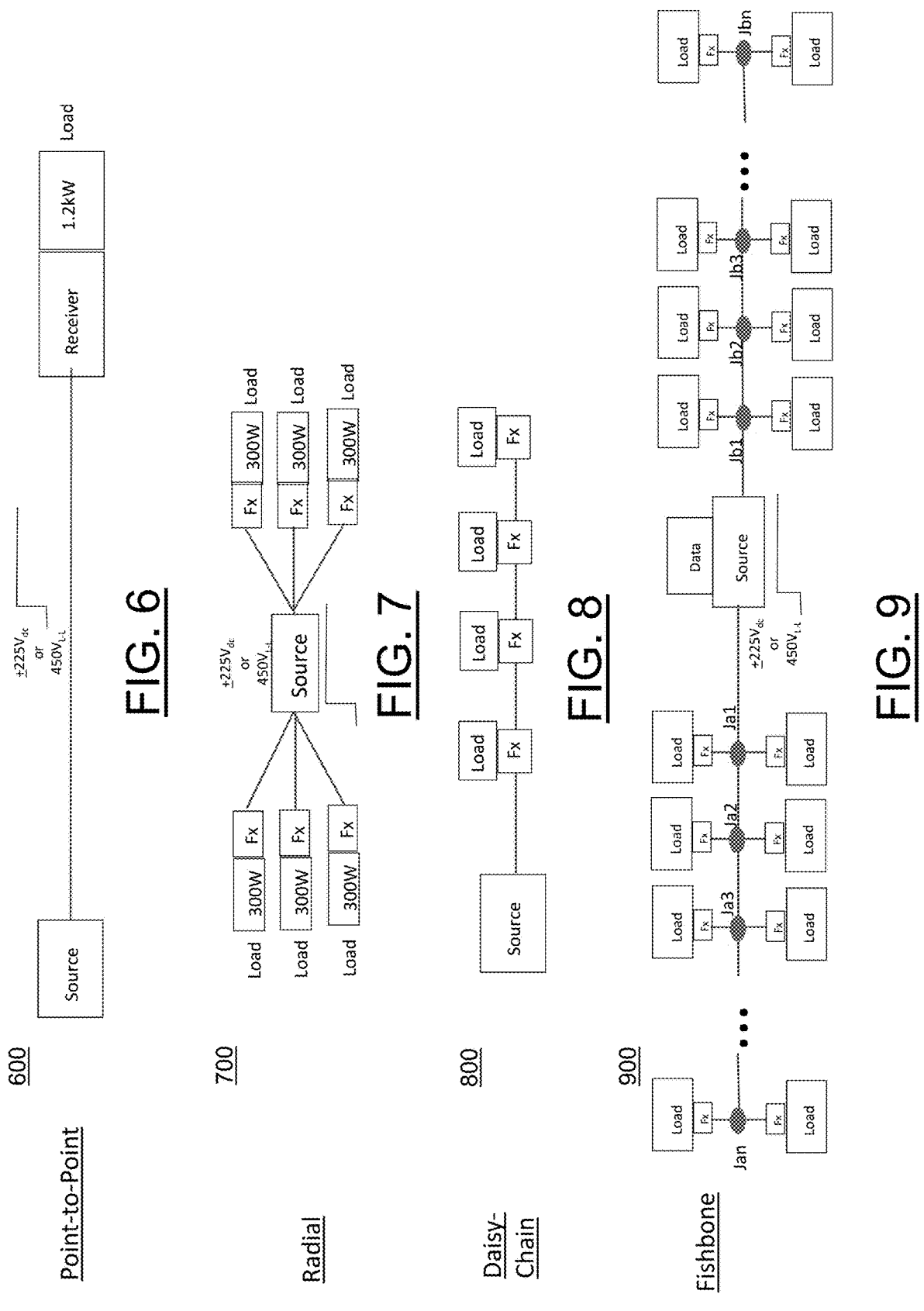
FIG. 6 illustrates an example of a point-to-point architecture in which the fault managed power system can be employed, in accordance with an embodiment of the present disclosure.
FIG. 7 illustrates an example of a radial architecture in which the fault managed power system can be employed, in accordance with an embodiment of the present disclosure.
FIG. 8 illustrates an example of a daisy chain architecture in which the fault managed power system can be employed, in accordance with an embodiment of the present disclosure.
FIG. 9 illustrates an example of a fishbone architecture in which the fault managed power system can be employed, in accordance with an embodiment of the present disclosure.
Figure 10:
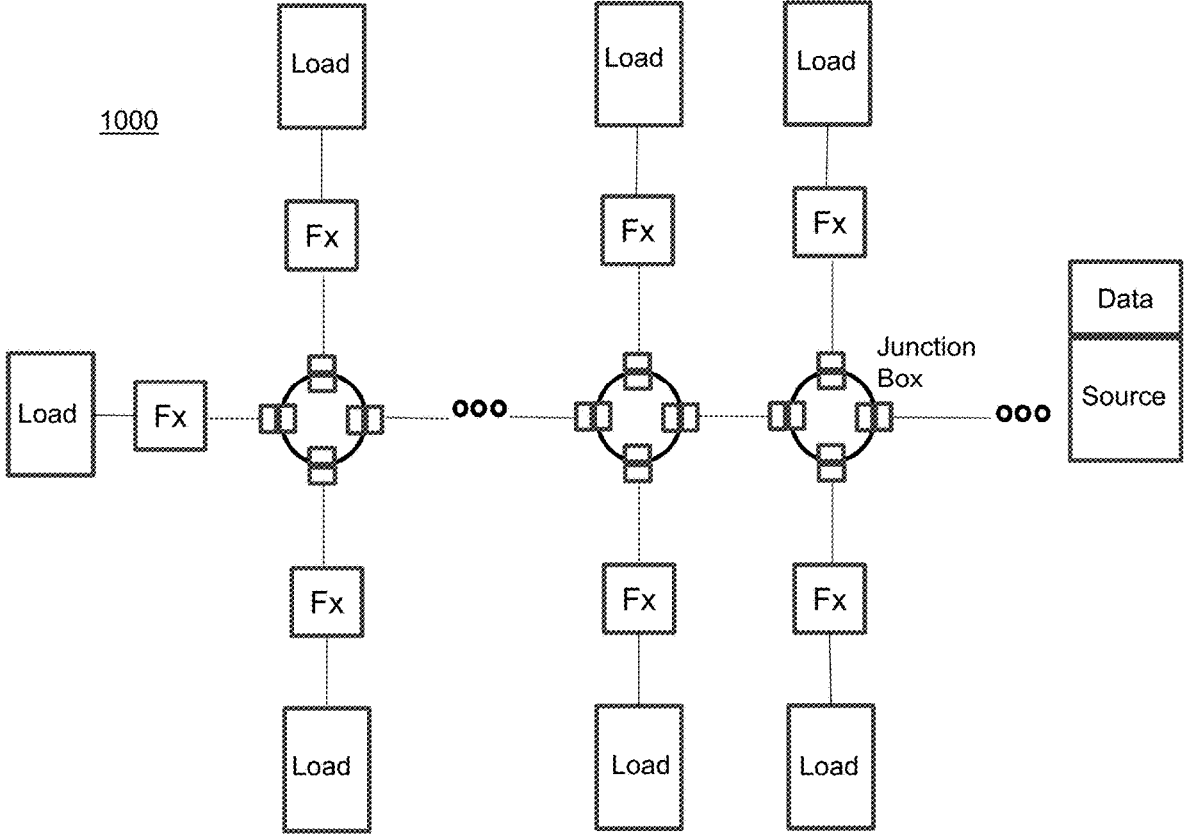
FIG. 10 illustrates an enlarged partial view of the fishbone architecture of FIG. 9 with junction boxes, and loads and associated load-side component(s) in which the fault managed power system can be employed, in accordance with an embodiment of the present disclosure.

FIG. 6 illustrates an example of a point-to-point architecture 600 in which the fault managed power system (as described herein) can be employed, in accordance with an embodiment of the present disclosure. As shown in FIG. 6, the architecture 600 includes a source, a downstream component(s), and a power cable connected between the source and the downstream component(s). The power cable can deliver electrical energy from a single source to a single group of downstream component(s) or Fx. The supplied electrical energy can be unipolar voltage (e.g., 450 Volts) or bipolar voltage (e.g., ±225 Volts).

FIG. 7 illustrates an example of a radial architecture 700 in which the fault managed power system (as described herein) can be employed, in accordance with an embodiment of the present disclosure. As shown in FIG. 7, the architecture 700 includes a single source which can supply electrical energy to a plurality of groups of downstream component(s) or Fx (and their associated loads) over respective power cables. A fault managed power subsystem can be implemented between the source and each group of downstream component(s) or Fx. The supplied electrical energy can be unipolar voltage (e.g., 450 Volts) or bipolar voltage (e.g., ±225 Volts).

FIG. 8 illustrates an example of a daisy chain architecture 800 in which the fault managed power system (as described herein) can be employed, in accordance with an embodiment of the present disclosure. As shown in FIG. 8, the architecture 800 includes a single source which can supply electrical energy to a plurality of groups of downstream component(s) or Fx (and their associated loads). The groups of downstream component(s) or Fx are connected in series across power cables. The supplied electrical energy can be unipolar voltage (e.g., 450 Volts) or bipolar voltage (e.g., ±225 Volts).

FIG. 9 illustrates an example of a fishbone architecture 900 in which the fault managed power system (as described herein) can be employed, in accordance with an embodiment of the present disclosure. As shown in FIG. 9, a source is connected to one or more series of junction boxes, which in turn are connected to a plurality of groups of downstream component(s) or Fx (e.g., a pair of groups of downstream component(s) or Fx). The supplied electrical energy can be unipolar voltage (e.g., 450 Volts) or bipolar voltage (e.g., ±225 Volts). Powerline communication can be conducted to transmit data across the fishbone architecture, for example by using frequencies which are not filtered out by the upstream or downstream filters or in the frequency ranges for detecting a fault. An enlarged partial view of the fishbone architecture of FIG. 9 is shown in the architecture 1000 of FIG. 10.

FIGS. 11 through 19 illustrate various examples of cable configuration, which can be employed in a fault managed power method and system (as described herein). In addition to the upstream and downstream filters, switch(es), power cable and power converter(s), the fault managed power system in these examples also can include additional upstream components, which may be incorporated on the source-side. These components can include a pulse generation circuitry and impedance sensor to measure electrical activity on the power cable. The measurements from the sensor can be used, for example, by a controller(s), to detect an occurrence of a fault, such as human body contact with the cable or other fault. In response to detection of an occurrence of a fault, electrical energy supplied to one or more power cables is interrupted (or prevented) using one or more switches. These exemplary fault managed power system are described in further detail below.

Figures 11, 12, 13:
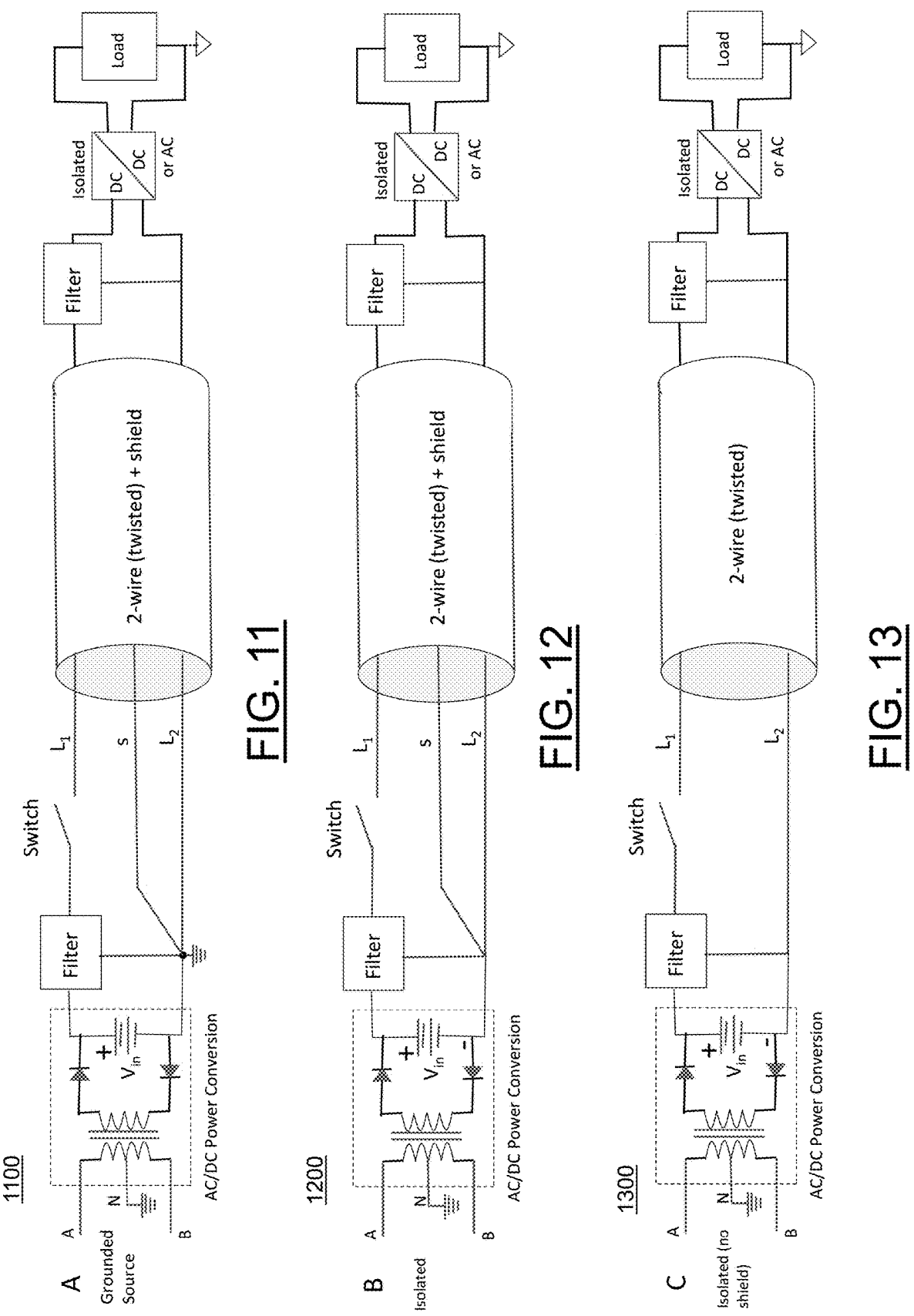
FIG. 11 illustrates a fault managed power system for a unipolar power configuration with a grounded source, 2-wire cable (shielded) and single switch, in accordance with an embodiment of the present disclosure.
FIG. 12 illustrates a fault managed power system for a unipolar power configuration with an isolated source, 2-wire cable (shielded) and single switch, in accordance with an embodiment of the present disclosure.
FIG. 13 illustrates a fault managed power system for a unipolar power configuration with an isolated source (no shield), 2-wire cable and single switch, in accordance with an embodiment of the present disclosure.

FIG. 11 illustrates a fault managed power system 1100 which employs a unipolar power configuration, in accordance with an embodiment. As shown in FIG. 11, the power system 1100 can include: a source including an upstream grounded source, an upstream power converter (e.g., AC/DC converter), an upstream filter and a single switch; a power cable; and a downstream component(s) including a downstream filter and downstream power converter (e.g., DC/DC converter or DC/AC converter) which is connected to a load. In this example, the power cable is a 2-wire (twisted) cable, which is shielded. As shown, the power cable includes conductors, such as line L1 and L2, and a shield s. The upstream switch is connected between the upstream filter and the conductor L1.

FIG. 12 illustrates a fault managed power system 1200 which employs a unipolar power configuration, in accordance with an embodiment. As shown in FIG. 12, the power system 1200 can include: a source including an upstream isolated source, an upstream power converter (e.g., AC/DC converter), an upstream filter and a single switch; a power cable; and a downstream component(s) including a downstream filter and downstream power converter (e.g., DC/DC converter or DC/AC converter) which is connected to a load. In this example, the power cable is a 2-wire (twisted) cable, which is shielded. As shown, the power cable includes conductors, such as line L1 and L2, and a shield s. The upstream switch is connected between the upstream filter and the conductor L1.

FIG. 13 illustrates a fault managed power system 1300 which employs a unipolar power configuration, in accordance with an embodiment. As shown in FIG. 13, the power system 1300 can include: a source including an upstream isolated source, an upstream power converter (e.g., AC/DC converter), an upstream filter and a single switch; a power cable; and a downstream component(s) including a downstream filter and downstream power converter (e.g., DC/DC converter or DC/AC converter) which is connected to a load. In this example, the power cable is a 2-wire (twisted) cable, which is unshielded. As shown, the power cable includes conductors, such as line L1 and L2. The upstream switch is connected between the upstream filter and the conductor L1.

Figures 14, 15, 16:
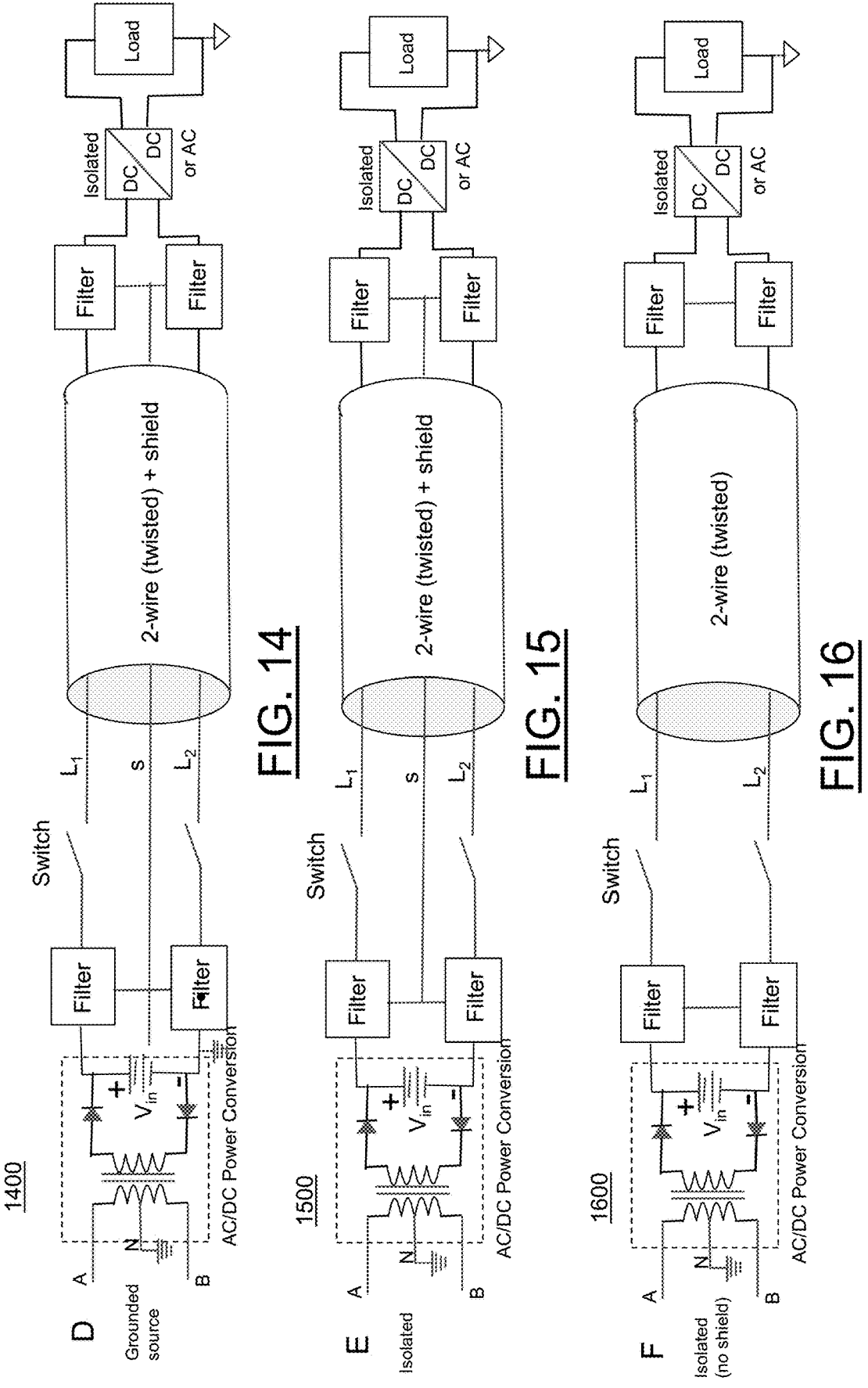
FIG. 14 illustrates a fault managed power system for a unipolar power configuration with a grounded source, 2-wire cable (shielded) and dual switch, in accordance with an embodiment of the present disclosure.
FIG. 15 illustrates a fault managed power system for a unipolar power configuration with an isolated source, 2-wire cable (shielded) and dual switch, in accordance with an embodiment of the present disclosure.
FIG. 16 illustrates a fault managed power system for a unipolar power configuration with an isolated source (no shield), 2-wire cable and dual switch, in accordance with an embodiment of the present disclosure.

FIG. 14 illustrates a fault managed power system 1400 which employs a unipolar power configuration, in accordance with an embodiment. As shown in FIG. 14, the power system 1400 can include: a source including an upstream grounded source, an upstream power converter (e.g., AC/DC converter), upstream filters and a dual switch; a power cable; and a downstream component(s) including downstream filters and downstream power converter (e.g., DC/DC converter or DC/AC converter) which is connected to a load. In this example, the power cable is a 2-wire (twisted) cable, which is shielded. As shown, the power cable includes conductors, such as line L1 and L2, and a shield s. Upstream and downstream filters are provided for conductors L1 and L2. The upstream dual switch is connected between upstream filters and their corresponding conductors (e.g., L1 and L2), and can be operated to connect or disconnect the conductors to or from a supply of electrical energy provided by the source or components thereof.

FIG. 15 illustrates a fault managed power system 1500 which employs a unipolar power configuration, in accordance with an embodiment. As shown in FIG. 15, the power system 1500 can include: a source including an upstream isolated source, an upstream power converter (e.g., AC/DC converter), upstream filters and a dual switch; a power cable; and a downstream component(s) including downstream filters and downstream power converter (e.g., DC/DC converter or DC/AC converter) which is connected to a load. In this example, the power cable is a 2-wire (twisted) cable, which is shielded. As shown, the power cable includes conductors, such as line L1 and L2, and a shield s. Upstream and downstream filters are provided for conductors L1 and L2. The upstream dual switch is connected between upstream filters and their corresponding conductors (e.g., L1 and L2), and can be operated to connect or disconnect the conductors to or from a supply of electrical energy provided by the source or components thereof.

FIG. 16 illustrates a fault managed power system 1600 which employs a unipolar power configuration, in accordance with an embodiment. As shown in FIG. 16, the power system 1600 can include: a source including an upstream isolated source, an upstream power converter (e.g., AC/DC converter), upstream filters and a dual switch; a power cable; and a downstream component(s) including downstream filters and downstream power converter (e.g., DC/DC converter or DC/AC converter) which is connected to a load. In this example, the power cable is a 2-wire (twisted) cable, which is unshielded. As shown, the power cable includes conductors, such as line L1 and L2. Upstream and downstream filters are provided for conductors L1 and L2. The upstream dual switch is connected between upstream filters and their corresponding conductors (e.g., L1 and L2), and can be operated to connect or disconnect the conductors to or from a supply of electrical energy provided by the source or components thereof.

Figures 17, 18, 19:
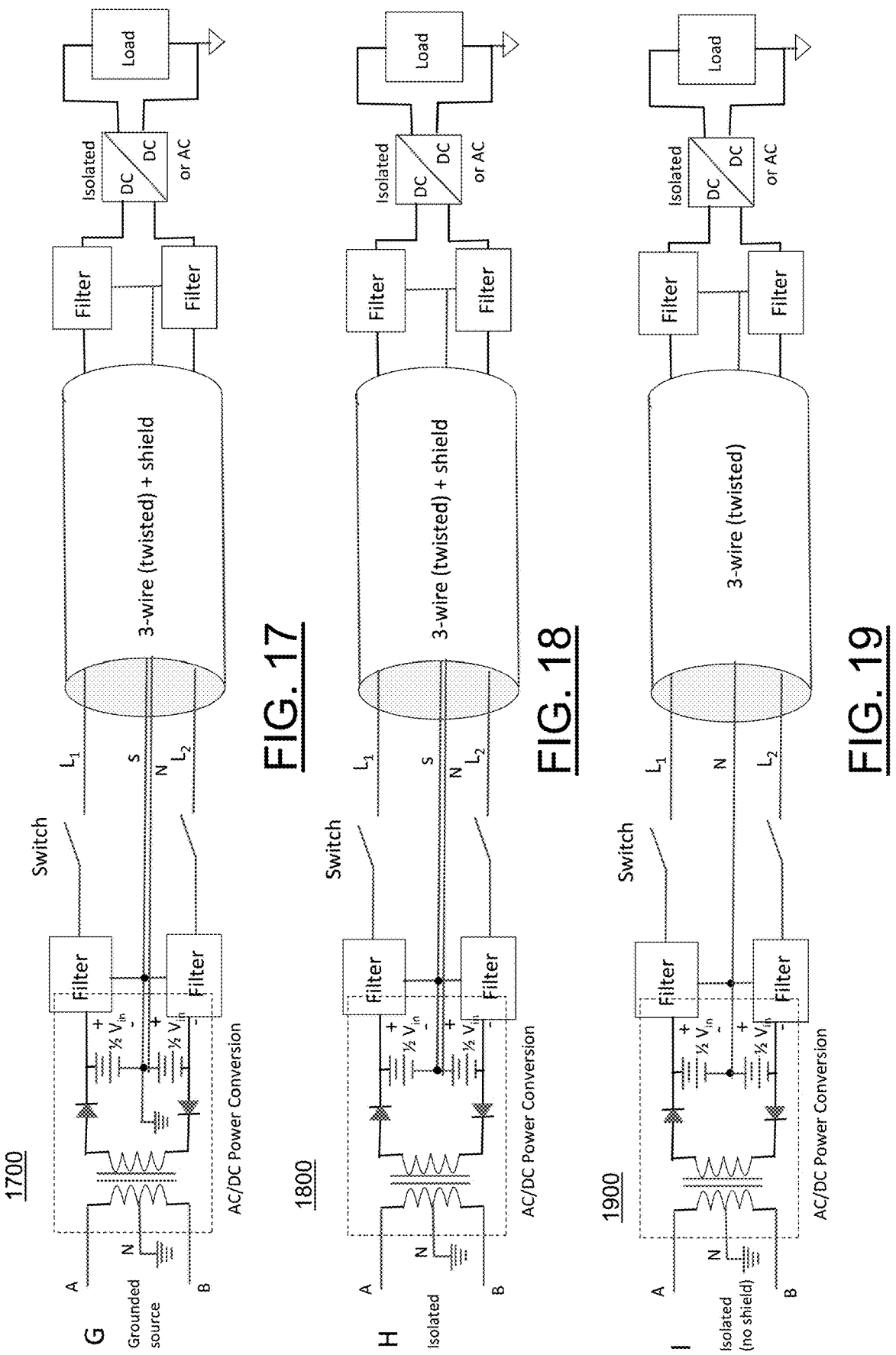
FIG. 17 illustrates a fault managed power system for a bipolar power configuration with a grounded source, 3-wire cable (shielded) and dual switch, in accordance with an embodiment of the present disclosure.
FIG. 18 illustrates a fault managed power system for a bipolar power configuration with an isolated source, 3-wire cable (shielded) and dual switch, in accordance with an embodiment of the present disclosure.
FIG. 19 illustrates a fault managed power system for a bipolar power configuration with an isolated source (no shield), 3-wire cable and dual switch, in accordance with an embodiment of the present disclosure.

FIG. 17 illustrates a fault managed power system 1700 which employs a bipolar power configuration, in accordance with an embodiment. As shown in FIG. 17, the power system 1700 can include: a source including an upstream grounded source, an upstream power converter (e.g., AC/DC converter), upstream filters and a dual switch; a power cable; and a downstream component(s) including downstream filters and downstream power converter (e.g., DC/DC converter or DC/AC converter) which is connected to a load. In this example, the power cable is a 2-wire (twisted) cable, which is shielded, and the upstream power converter can provide for bipolar power. As shown, the power cable includes conductors, such as line L1 and L2 and Neutral N, and a shield s. Upstream and downstream filters are provided for conductors L1 and L2. The upstream dual switch is connected between upstream filters and their corresponding conductors (e.g., L1 and L2), and can be operated to connect or disconnect the conductors to or from a supply of electrical energy provided by the source or components thereof.

FIG. 18 illustrates a fault managed power system 1800 which employs a bipolar power configuration, in accordance with an embodiment. As shown in FIG. 18, the power system 1800 can include: a source including an upstream isolated source, an upstream power converter (e.g., AC/DC converter), upstream filters and a dual switch; a power cable; and a downstream component(s) including downstream filters and downstream power converter (e.g., DC/DC converter or DC/AC converter) which is connected to a load. In this example, the power cable is a 2-wire (twisted) cable, which is shielded, and the upstream power converter can provide for bipolar power. As shown, the power cable includes conductors, such as line L1 and L2 and Neutral N, and a shield s. Upstream and downstream filters are provided for conductors L1 and L2. The upstream dual switch is connected between upstream filters and their corresponding conductors (e.g., L1 and L2), and can be operated to connect or disconnect the conductors to or from a supply of electrical energy provided by the source or components thereof.

FIG. 19 illustrates a fault managed power system 1900 which employs a bipolar power configuration, in accordance with an embodiment. As shown in FIG. 19, the power system 1900 can include: a source including an upstream isolated source, an upstream power converter (e.g., AC/DC converter), upstream filters and a dual switch; a power cable; and a downstream component(s) including downstream filters and downstream power converter (e.g., DC/DC converter or DC/AC converter) which is connected to a load. In this example, the power cable is a 2-wire (twisted) cable, which is unshielded, and the upstream power converter can provide for bipolar power. As shown, the power cable includes conductors, such as line L1 and L2 and Neutral N. Upstream and downstream filters are provided for conductors L1 and L2. The upstream dual switch is connected between upstream filters and their corresponding conductors (e.g., L1 and L2), and can be operated to connect or disconnect the conductors to or from a supply of electrical energy provided by the source or components thereof.

FIG. 20 illustrates an example of sample data of a calibration table such as voltage reference (Vref) Table, in accordance with an embodiment of the present disclosure. As shown, the calibration table can include a table or array of positive reference voltages and a table or array of negative reference voltages. These calibration measurements can be taken by a sensor from which sensor measurements are to be used to detect conditions on an electrical or power system. In various embodiments, the sensor can be or include an impedance sensor or RC-circuit, and the reference voltages can be measurements across a capacitor of the sensor, which can be taken when the source/source circuit is in an open circuit state (e.g., open circuit test). As described herein, the reference values can be scaled for use in performing detection of conditions, such as contact of power cable or other faults on the electrical or power system. It should also be understood that the example embodiments disclosed and taught herein are susceptible to numerous and various modifications and alternative forms. Thus, the use of a singular term, such as, but not limited to, "a" and the like, is not intended as limiting of the number of items. Furthermore, the naming conventions for the various components, functions, characteristics, thresholds, and other elements used herein are provided as examples, and can be given a different name or label. The use of the term "or" is not limited to exclusive "or", but can also mean "and/or".

It will be appreciated that the development of an actual, real commercial application incorporating aspects of the disclosed embodiments will require many implementation specific decisions to achieve the developer's ultimate goal for the commercial embodiment. Such implementation specific decisions may include, and likely are not limited to, compliance with system related, business related, government related and other constraints, which may vary by specific implementation, location and from time to time. While a developer's efforts might be complex and time consuming in an absolute sense, such efforts would nevertheless be a routine undertaking for those of skill in this art having the benefit of this disclosure.

Using the description provided herein, the example embodiments may be implemented as a machine, process, or article of manufacture by using standard programming and/or engineering techniques to produce programming software, firmware, hardware or any combination thereof.

Any resulting program(s), having computer-readable program code, may be embodied on one or more tangible or non-transitory computer-usable media such as resident memory devices, smart cards or other removable memory devices, or transmitting devices, thereby making a computer program product or article of manufacture according to the embodiments. As such, the terms "article of manufacture" and "computer program product" as used herein are intended to encompass a computer program that exists permanently or temporarily on any computer-usable or storage medium or in any transmitting medium which transmits such a program.

A processor(s), controller(s) or processing unit(s) as described herein can be a processing system, which can include one or more processors, such as CPU, controller, ASIC, or other processing unit or circuitry, which controls or performs the operations of the devices or systems, described herein. Memory/storage devices can include, but are not limited to, disks, solid state drives, optical disks, removable memory devices such as smart cards, SIMs, WIMs, semiconductor memories such as RAM, ROM, PROMS, etc. Transmitting mediums or networks include, but are not limited to, transmission via wireline communication, wireless communication (e.g., Radio Frequency (RF) communication, Bluetooth®, Wi-Fi, Li-Fi, etc.), the Internet, intranets, telephone/modem-based network communication, hard-wired/cabled communication network, satellite communication, and other stationary or mobile network systems/communication links. The wireline communication can include powerline communication.

The flowchart and block diagrams in the Figures illustrate the architecture, functionality and/or operation of possible implementations of various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention as defined in the appended claims.

The invention claimed is:

1. A method of calibrating a detection process for detecting a condition of an electrical system, the electrical system including a source circuit configured to, in a closed circuit state, electrically connect to a downstream circuit or, in an open circuit state, electrically disconnect from the downstream circuit, the method comprising:

measuring, using a sensor, a reference voltage across the source circuit in the open circuit state for a predefined time period when a first system voltage for calibration is applied to the source circuit, a plurality of measurements of the reference voltage being taken by the sensor over time and stored in a memory;

measuring, using the sensor, a voltage across the source circuit in the open circuit state for the predefined time period when a second system voltage, which can be different than the first system voltage, is applied to the source circuit, scaling, in relation to the second system voltage, a reference voltage from the plurality of measurements of the reference voltage according to a ratio of the second system voltage and the first system voltage to provide a scaled reference voltage;

calculating a difference between the scaled reference voltage and the voltage measured across the source circuit by the sensor at the second system voltage;

calculating a voltage change over time between a prior voltage and the voltage measured by the sensor over the predefined time period at the second system voltage;

comparing the difference and the voltage change over time to respective thresholds;

determining that the condition of the electrical system has occurred using results of the comparing; and in response to determining that the condition of the electrical system has occurred, interrupting a supply of power to the downstream circuit via one or more of a plurality of switches.

2. The method according to claim 1, wherein the thresholds and the plurality of measurements of reference values are scaled according to a ratio between the second system voltage and the first system voltage.

3. The method according to claim 1, wherein, in the electrical system, the source circuit includes a low-pass filter and is connected to a power cable, which in turn is connected to downstream electrical component(s) including at least a low-pass filter, the low-pass filters of the source circuit and downstream electrical component(s) preventing upstream and downstream noise or signals across the power cable, the sensor being situated between the low-pass filter of the source circuit and the power cable to sense voltage across the power cable, wherein the condition comprises a fault resulting from body contact with the power cable or other types of faults.

4. The method according to claim 1, further comprising:

detecting a type of circuit configuration of the downstream circuit; and configuring the thresholds according to the detected configuration of the downstream circuit, wherein the type of circuit configuration includes a single load or a plurality of loads, and the downstream circuit comprises the single load or one or more of the plurality of loads.

5. The method according to claim 1, wherein the scaling comprises:

calculating a ratio of the second system voltage to the first system voltage; and calculating the scaled reference voltage which is equal to the calculated ratio multiplied by the reference voltage from the plurality of measurements of the reference voltage.

6. The method according to claim 1, wherein the sensor comprises an RC-circuit or an impedance sensor, the reference voltage and the voltage being a measurement of a voltage across a capacitor of the RC-circuit or impedance sensor.

7. The method according to claim 1, wherein the source circuit includes the plurality of switches comprising a first switch and a second switch, the first switch configured to electrically connect or disconnect the source circuit to or from a system input supplying system voltage, and the second switch configured to electrically connect or disconnect the source circuit to or from the downstream circuit.

8. The method according to claim 1, wherein the scaling operation and calculating operations are performed according to the following equations:

$$\text{Ratio} = V_s/V_{rated};$$

$$V_s = V_{in}(R_1 + R_2)/R_2;$$

$$V_{ref[i]} = \text{Ratio} * V_{ref}\_\text{Table}[i];$$

$$\text{Delta} = V_{ref}[i] - V_C[i]; \text{ and}$$

$$\text{Slope} = (V_C[i-1] - V_C[i])/T_{delta},$$

where:

$V_{rated}$ is a first system voltage for the source circuit for calibration, $V_s$ is a second system voltage corresponding to an applied system voltage for the source circuit, $V_{in}$ is a scaled second system voltage corresponding to an applied (operating) system voltage for the source circuit, $V_{ref}\_\text{Table}[i]$ is a calibration table of the plurality of measurements of the reference voltage (V_Ref2, V_Ref3, V_Ref4, V_Ref5, . . . , V_Refn), $T_{delta}$ is a step time or time interval, Delta is the difference, Slope is the voltage change over time, and i=1 to n.

9. The method according to claim 1, further comprising selectively controlling the one or more of the plurality of switches using one or more processors.

10. A system for calibrating a detection process to detect a condition of an electrical system, the electrical system including a source circuit configured to, in a closed circuit state, electrically connect to a downstream circuit or, in an open circuit state, electrically disconnect from the downstream circuit, the system comprising:

a memory;

a sensor; and a controller configured to:

obtain, from a sensor, a first measurement indicative of a reference voltage across the source circuit in the open circuit state for a predefined time period when a first system voltage for calibration is applied to the source circuit, a plurality of measurements indicative of the reference voltage being taken by the sensor over time and stored in the memory;

obtain, from the sensor, a second measurement indicative of an applied voltage across the source circuit in the open circuit state for the predefined time period when a second system voltage, which can be different than the first system voltage, is applied to the source circuit, scale, in relation to the second system voltage, a reference voltage from the plurality of the measurements indicative of the reference voltage according to a ratio of the second system voltage and the first system voltage to provide a scaled reference voltage;

calculate a difference between the scaled reference voltage and the voltage measured across the source circuit by the sensor at the second system voltage;

calculate a voltage change over time between a prior voltage and the voltage measured by the sensor over the predefined time period at the second system voltage;

compare the difference and the voltage change over time to respective thresholds;

determine that the condition of the electrical system has occurred using results of the comparing; and in response to determining that the condition of the electrical system has occurred, cause an interruption of a supply of power to the downstream circuit via one or more of a plurality of switches.

11. The system according to claim 10, wherein the thresholds and the plurality of measurements of reference values are scaled according to a ratio between the second system voltage and the first system voltage.

12. The system according to claim 10, wherein, in the electrical system, the source circuit includes a low-pass filter and is connected to a power cable, which in turn is connected to downstream electrical component(s) including at least a low-pass filter, the low-pass filters of the source circuit and downstream electrical component(s) preventing upstream and downstream noise or signals across the power cable, the sensor being situated between the low-pass filter of the source circuit and the power cable to sense voltage across the power cable, wherein the condition comprises a fault resulting from body contact with the power cable or other types of faults.

13. The system according to claim 10, further comprising:

detecting a type of circuit configuration of the downstream circuit; and configuring the thresholds according to the detected configuration of the downstream circuit, wherein the type of circuit configuration includes a single load or a plurality of loads, and the downstream circuit comprises the single load or one or more of the plurality of loads.

14. The system according to claim 10, wherein, to scale, the controller is configured to:

calculate a ratio of the second system voltage to the first system voltage; and calculate the scaled reference voltage which is equal to the calculated ratio multiplied by the reference voltage from the plurality of measurements indicative of the reference voltage.

15. The system according to claim 10, wherein the sensor comprises an RC-circuit or an impedance sensor, the reference voltage and the applied voltage being a measurement of a voltage across a capacitor of the RC-circuit or impedance sensor.

16. The system according to claim 10, wherein the source circuit includes the plurality of switches comprising a first switch and a second switch, the first switch configured to electrically connect or disconnect the source circuit to or from a system input supplying system voltage, and the second switch configured to electrically connect or disconnect the source circuit to or from the downstream circuit, the controller being configured to selectively control the first and second switches.

17. The system according to claim 10, wherein the controller is configured to implement the scaling operation and calculating operations according to the following equations:

$$\text{Ratio} = V_s/V_{rated};$$

$$V_s = V_{in}(R_1 + R_2)/R_2;$$

$$V_{ref[i]} = \text{Ratio} * V_{ref\_}\text{Table}[i[;$$

$$\text{Delta} = V_{ref}[i] - V_C[i]; \text{ and}$$

$$\text{Slope} = (V_C[i-1] - V_C[i])/T_{delta},$$

where:
  $V_{rated}$ is a first system voltage for the source circuit for calibration,
  $V_s$ is a second system voltage corresponding to a current system voltage for the source circuit,
  $V_{in}$ is a scaled second system voltage corresponding to an applied (operating) system voltage for the source circuit,
  Vref_Table[i] is a table of the plurality of measurements indicative of the reference voltage (V_Ref1, V_Ref2, V_Ref3, V_Ref4, V_Ref5, . . . , V_Refn),
  $T_{delta}$ is a step time or time interval,
  Delta is the difference,
  Slope is the voltage change over time, and
  i=1 to n.

18. The system according to claim 10, wherein at least one of the plurality of switches comprises an electro-mechanical switch, an electronic switch, or a crowbar circuit.

19. A non-transitory computer storage device for storing computer executable code, which when executed by one or more processors, implements a method of calibrating a detection process for detecting a condition of an electrical system, the electrical system including a source circuit configured to, in a closed circuit state, electrically connect to a downstream circuit or, in an open circuit state, electrically disconnect from the downstream circuit, the method comprising:
  measuring, using a sensor, a reference voltage across the source circuit in the open circuit state for a predefined time period when a first system voltage for calibration is applied to the source circuit, a plurality of measurements of the reference voltage being taken by the sensor over time and stored in a memory;
  measuring, using the sensor, a voltage across the source circuit in the open circuit state for the predefined time period when a second system voltage, which is different than the first system voltage, is applied to the source circuit,
  scaling, in relation to the second system voltage, a reference voltage from the plurality of measurements of the reference voltage according to a ratio of the second system voltage and the first system voltage to provide a scaled reference voltage;
  calculating a difference between the scaled reference voltage and the voltage measured across the source circuit by the sensor at the second system voltage;
  calculating a voltage change over time between a prior voltage and the voltage measured by the sensor over the predefined time period at the second system voltage;
  comparing the difference and the voltage change over time to respective thresholds;
  determining that the condition of the electrical system has occurred using results of the comparing; and
  in response to determining that the condition of the electrical system has occurred, interrupting a supply of power to the downstream circuit via one or more of a plurality of switches.

20. The non-transitory computer storage device according to claim 19, wherein the source circuit includes the plurality of switches comprising a first switch and a second switch, the first switch configured to electrically connect or disconnect the source circuit to or from a system input supplying system voltage, and the second switch configured to electrically connect or disconnect the source circuit to or from the downstream circuit, the downstream circuit comprising a load or an electrical component connected to the load, and the method further comprising causing selective control of the first switch and the second switch.

* * * * *